United States Patent
Park et al.

(10) Patent No.: US 12,217,703 B2
(45) Date of Patent: Feb. 4, 2025

(54) ELECTRONIC DEVICE

(71) Applicant: SAMSUNG DISPLAY CO., LTD., Yongin-si (KR)

(72) Inventors: So-Young Park, Yongin-si (KR); Soongyu Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/366,762

(22) Filed: Aug. 8, 2023

(65) Prior Publication Data

US 2024/0169930 A1    May 23, 2024

(30) Foreign Application Priority Data

Nov. 21, 2022 (KR) ........................ 10-2022-0156772

(51) Int. Cl.
   *G09G 3/32* (2016.01)
   *G06F 3/044* (2006.01)
   *G09G 3/3275* (2016.01)

(52) U.S. Cl.
   CPC ................................. G09G 3/3275 (2013.01)

(58) Field of Classification Search
   CPC .................................................... G09G 3/3275
   See application file for complete search history.

(56) References Cited

U.S. PATENT DOCUMENTS

| | | | | |
|---|---|---|---|---|
| 10,725,591 B1* | 7/2020 | Maharyta | .............. | G06F 3/0446 |
| 10,838,547 B1* | 11/2020 | Shen | ..................... | G06F 3/0443 |
| 11,455,059 B1* | 9/2022 | Malkin | ............... | G06F 3/04166 |
| 11,487,391 B2* | 11/2022 | Mohamed | ............... | G06F 3/044 |
| 2013/0106779 A1* | 5/2013 | Company Bosch | | ........................ G06F 3/04182 345/174 |
| 2013/0194225 A1* | 8/2013 | Shen | ..................... | G06F 3/0446 345/174 |
| 2013/0194229 A1* | 8/2013 | Sabo | ..................... | G06F 3/0412 345/174 |
| 2014/0049507 A1* | 2/2014 | Shepelev | ............ | G06F 3/04184 345/174 |
| 2015/0242015 A1* | 8/2015 | Cho | ..................... | G06F 3/04166 345/174 |

(Continued)

FOREIGN PATENT DOCUMENTS

| KR | 10-2018-0076512 | 7/2018 |
|---|---|---|
| KR | 10-2019-0136309 | 12/2019 |

(Continued)

*Primary Examiner* — Ibrahim A Khan

(74) *Attorney, Agent, or Firm* — F. Chau & Associates, LLC

(57) ABSTRACT

An electronic device includes a display layer configured to display an image, a sensor layer disposed on the display layer and including a plurality of first electrodes and a plurality of second electrodes, and a sensor driver configured to drive the sensor layer and selectively operate in a first mode or a second mode different from the first mode. When operating in the second mode, the sensor driver is configured to selectively operate in a first driving mode to simultaneously output a plurality of first transmission signals to the plurality of first electrodes or in a second driving mode to simultaneously output a plurality of second transmission signals different from the plurality of first transmission signals to the plurality of first electrodes.

20 Claims, 32 Drawing Sheets

(56) References Cited

U.S. PATENT DOCUMENTS

| | | | | |
|---|---|---|---|---|
| 2015/0261377 A1* | 9/2015 | Reynolds | ......... | G06F 3/041662 |
| | | | | 345/174 |
| 2017/0364184 A1* | 12/2017 | Weinerth | .............. | G06F 3/0446 |
| 2019/0286321 A1* | 9/2019 | Kim | ..................... | G06F 1/3262 |
| 2020/0264727 A1* | 8/2020 | Lee | ....................... | G06F 3/044 |
| 2022/0121298 A1* | 4/2022 | Ding | .................... | H03G 3/344 |
| 2022/0244829 A1 | 8/2022 | Lee et al. | | |
| 2023/0251738 A1* | 8/2023 | Nakano | .............. | G06F 3/04182 |
| | | | | 345/173 |
| 2023/0393686 A1* | 12/2023 | Van Ostrand | ........ | G06F 3/0446 |

FOREIGN PATENT DOCUMENTS

| KR | 10-2021-0083909 | 7/2021 |
|---|---|---|
| KR | 10-2022-0111818 | 8/2022 |

\* cited by examiner

ELECTRONIC DEVICE

CROSS-REFERENCE TO RELATED APPLICATIONS

This U.S. non-provisional patent application claims priority under 35 U.S.C. § 119 of Korean Patent Application No. 10-2022-0156772, filed on Nov. 21, 2022, the entire contents of which are hereby incorporated by reference.

BACKGROUND

1. Technical Field

One or more embodiments described herein relate to an electronic device having a proximity sensing function.

2. Description of the Related Art

A variety of multimedia electronic devices have been developed. Examples include televisions, mobile phones, tablet computers, navigation devices, and game consoles display images. These devices have features for inputting information such as buttons, keyboards, and mice. Some of these devices further performs a touch-based input method that allows a user to easily and intuitively input information or commands.

SUMMARY

One or more embodiments described herein provide an electronic device including a sensor layer having a proximity sensing function.

An embodiment of the inventive concept provides an electronic device including: a display layer configured to display an image; a sensor layer disposed on the display layer and including a plurality of first electrodes and a plurality of second electrodes; and a sensor driver configured to drive the sensor layer and selectively operate in a first mode or a second mode different from the first mode, wherein, in the second mode, the sensor driver is configured to selectively operate in a first driving mode to simultaneously output a plurality of first transmission signals to the plurality of first electrodes or in a second driving mode to simultaneously output a plurality of second transmission signals different from the plurality of first transmission signals to the plurality of first electrodes.

In an embodiment, the plurality of first transmission signals may be signals of a same phase.

In an embodiment, the plurality of second transmission signals may be signals of a same phase.

In an embodiment, a frequency of each of the plurality of second transmission signals may be hopping.

In an embodiment, a frequency of each of the plurality of second transmission signals may be hopped every frame.

In an embodiment, a frequency of each of the plurality of second transmission signals may be hopped within one frame.

In an embodiment, intervals in which the frequency is hopped within the one frame may be same as each other.

In an embodiment, a frequency of each of the plurality of second transmission signals may be hopped for each of a plurality of sub frames included in one frame.

In an embodiment, a frequency of each of the plurality of second transmission signals may be hopped in each of a plurality of sub frames included in one frame.

In an embodiment, in the second driving mode, the sensor driver simultaneously may output the plurality of second transmission signals and a plurality of third transmission signals having a frequency different from the frequency of the plurality of second transmission signals to the plurality of first electrodes.

In an embodiment, the plurality of second transmission signals may include a 2-1 transmission signal having a first phase and a 2-2 transmission signal having a second phase different from the first phase, wherein, among the plurality of first electrodes, the number of 1-1 electrodes to which the 2-1 transmission signal is provided and the number of 1-2 electrodes to which the 2-2 transmission signal is provided may be different from each other.

In an embodiment, positions of the 1-2 electrodes to which the 2-2 transmission signal is provided may be determined every frame.

In an embodiment, positions of the 1-2 electrodes to which the 2-2 transmission signal is provided may be changed within one frame.

In an embodiment, in the second driving mode, the sensor driver may operate in a normal phase driving mode for simultaneously outputting the plurality of second transmission signals to the plurality of first electrodes and in a reverse phase driving mode for simultaneously outputting a plurality of third transmission signals having a phase different from a phase of the plurality of second transmission signals to the plurality of first electrodes.

In an embodiment, the sensor driver may operate in at least one of the normal phase driving mode and the reverse phase driving mode for every frame.

In an embodiment, the sensor driver may operate in at least one of the normal phase driving mode and the reverse phase driving mode for each of a plurality of sub frames included in one frame.

In an embodiment of the inventive concept, an electronic device includes: a sensor layer including a plurality of first electrodes and a plurality of second electrodes; and a sensor driver configured to drive the sensor layer and selectively operate in a proximity sensing mode or a touch sensing mode, wherein, in the proximity sensing mode, the sensor driver is configured to selectively operate in a first driving mode for simultaneously outputting a plurality of first transmission signals of a same phase to the plurality of first electrodes or in a second driving mode for simultaneously outputting a plurality of second transmission signals different from the plurality of first transmission signals to the plurality of first electrodes.

In an embodiment, a frequency of each of the plurality of second transmission signals may be hopped, wherein the frequency may hop every frame, hop every plurality of sub frames included in one frame, or hop within each of the plurality of sub frames.

In an embodiment, in the second driving mode, the sensor driver may operate in a normal phase driving mode for simultaneously outputting the plurality of second transmission signals to the plurality of first electrodes, and in a reverse phase driving mode for simultaneously outputting a plurality of third transmission signals having phases different from phases of the plurality of second transmission signals to the plurality of first electrodes, wherein the sensor driver may operate in at least one of the normal phase driving mode and the reverse phase driving mode every frame, or wherein the sensor driver may operate in at least one of the normal phase driving mode and the reverse phase driving mode for each of a plurality of sub frames included in one frame.

In an embodiment, the plurality of second transmission signals may include a 2-1 transmission signal having a first phase and a 2-2 transmission signal having a second phase different from the first phase, wherein, among the plurality of first electrodes, the number of 1-1 electrodes to which the 2-1 transmission signal is provided and the number of 1-2 electrodes to which the 2-2 transmission signal may be different from each other, wherein positions of the 1-2 electrodes to which the 2-2 transmission signal is provided may be changed every frame or changed within one frame.

In accordance with one or more embodiments, a method of controlling an electronic device includes detecting occurrence of an event; changing from a first driving mode to a second driving mode; changing a parameter of a transmission signal; and providing the transmission signal to an electrode of a sensor layer of the electronic device. The second driving mode corresponds to a proximity sensing mode, and the parameter of the transmission signal is changed over a predetermined time period.

The predetermined time period may be a frame, and the parameter of the transmission signal may be changed across different sub-frames of the frame. The predetermined time period may include at least two frames, and the parameter of the transmission signal may be changed across different ones of the at least two frames. The predetermined time period may be a subframe of a frame, and the parameter of the transmission signal may be changed across different time periods included in the subframe. The parameter may be a frequency or phase of the transmission signal, or both. The event may be based on a change in proximity of the electronic device to a body part of a user. The event may include detection of flicker.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1:
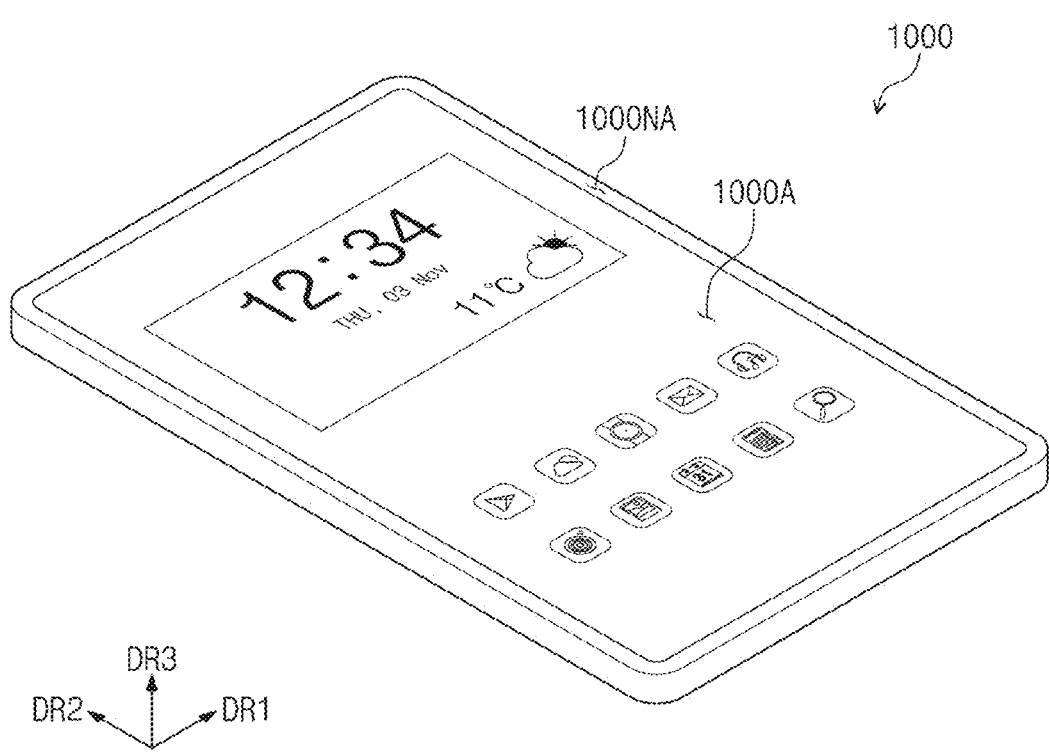
FIG. 1 is a perspective view of an electronic device according to an embodiment of the inventive concept.

In this specification, when an element (or region, layer, part, etc.) is referred to as being "on", "connected to", or "coupled to" another element, it means that it may be directly placed on/connected to/coupled to other components, or a third component may be arranged between them.

Like reference numerals refer to like elements. Additionally, in the drawings, the thicknesses, proportions, and dimensions of components are exaggerated for effective description. "And/or" includes all of one or more combinations defined by related components.

It will be understood that the terms "first" and "second" are used herein to describe various components but these components should not be limited by these terms. The above terms are used only to distinguish one component from another. For example, a first component may be referred to as a second component and vice versa without departing from the scope of the inventive concept. The terms of a singular form may include plural forms unless otherwise specified.

In addition, terms such as "below", "the lower side", "on", and "the upper side" are used to describe a relationship of components shown in the drawing. The terms are described as a relative concept based on a direction shown in the drawing.

In various embodiments of the inventive concept, the term "include," "comprise," "including," or "comprising," specifies a property, a region, a fixed number, a step, a process, an element and/or a component but does not exclude other properties, regions, fixed numbers, steps, processes, elements and/or components.

Unless otherwise defined, all terms (including technical and scientific terms) used herein have the same meaning as commonly understood by one of ordinary skill in the art to which this inventive concept belongs. In addition, terms such as terms defined in commonly used dictionaries should be interpreted as having a meaning consistent with the meaning in the context of the related technology, and it should not be construed in an overly ideal or overly formal sense unless explicitly defined here.

Hereinafter, embodiments of the inventive concept will be described with reference to the drawings.

FIG. 1 is a perspective view of an electronic device 1000 according to an embodiment of the inventive concept. Referring to FIG. 1, an electronic device 1000 may be a device that is activated according to an electrical signal. For example, the electronic device 1000 may be a mobile phone, a foldable mobile phone, a notebook computer, a television, a tablet, a car navigation system, a game console, or a wearable device, but is not limited thereto. FIG. 1 illustrates that the electronic device 1000 is a mobile phone.

An active area 1000A and a peripheral area 1000NA may be included in the electronic device 1000. The electronic device 1000 may display an image through the active area 1000A. The active area 1000A may include a surface extending in the first direction DR1 and the second direction DR2. The peripheral area 1000NA may partially or completely surround the active area 1000A. In one embodiment of the inventive concept, the peripheral area 1000NA may be omitted.

The thickness direction of the electronic device 1000 may be parallel to the third direction DR3 intersecting the first direction DR1 and the second direction DR2. Accordingly, the front (or upper) and rear (or lower) surfaces of the members constituting the electronic device 1000 may be defined with respect to the third direction DR3.

FIG. 1 illustrates a bar-type electronic device 1000, but the inventive concept is not limited thereto. For example, descriptions described below may be applied to various electronic devices such as the foldable electronic device 1000, the rollable electronic device 1000, or the slidable electronic device 1000.

Figure 2:
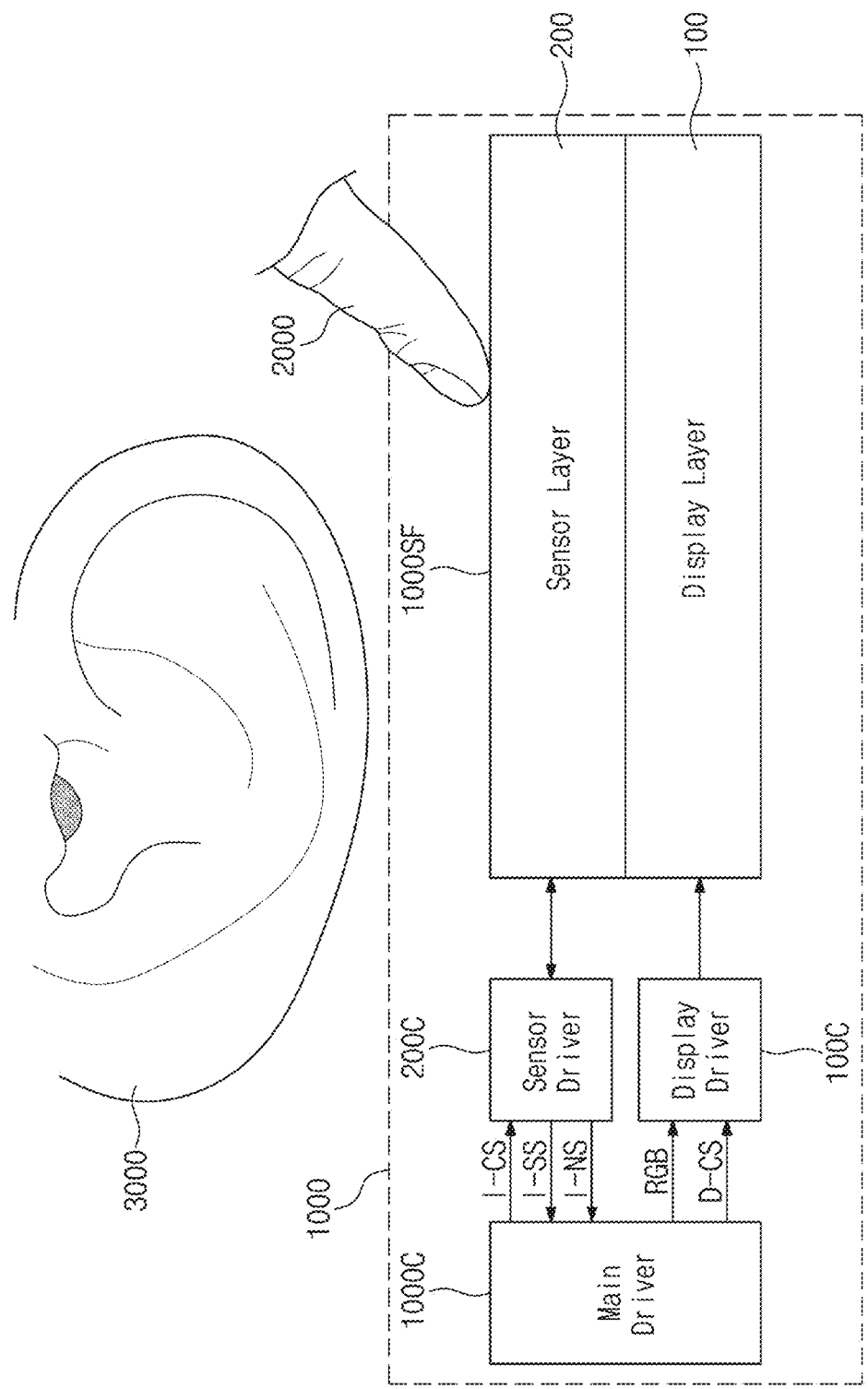
FIG. 2 is a diagram for explaining the operation of an electronic device according to an embodiment of the inventive concept.

FIG. 2 is a diagram illustrating an operation of an electronic device 1000 according to an embodiment of the inventive concept.

Referring to FIG. 2, the electronic device 1000 may include a display layer 100, a sensor layer 200, a display driver 100C, a sensor driver 200C, and a main driver 1000C. The display layer 100 may substantially generate an image. The display layer 100 may be a light emitting display layer. For example, the display layer 100 may be an organic light emitting display layer, an inorganic light emitting display layer, an organic-inorganic light emitting display layer, a quantum dot display layer, a micro LED display layer, or a nano LED display layer.

The sensor layer 200 may be disposed on the display layer 100. The sensor layer 200 may detect an externally applied input 2000 or 3000. The external input 2000 or 3000 may include any input capable of providing a change in capacitance. For example, the sensor layer 200 may detect an input by not only a passive type input such as a part of a user's body, but also an active type input that provides a driving signal.

The main driver 1000C may control overall operation of the electronic device 1000. For example, the main driver 1000C may control operation of the display driver 100C and the sensor driver 200C. The main driver 1000C may include at least one microprocessor and may further include a graphics controller. The main driver 1000C may be referred to, for example, as an application processor, a central processing unit, a main processor, controller, or another type of control or processing device.

The display driver 100C may drive the display layer 100. The display driver 100C may receive image data RGB and a control signal D-CS from the main driver 1000C. The control signal D-CS may include various signals. For example, the control signal D-CS may include an input vertical synchronization signal, an input horizontal synchronization signal, a main clock, and a data enable signal. The display driver 100C may generate a vertical synchronization signal and a horizontal synchronization signal for controlling timing of providing a signal to the display layer 100 based on the control signal D-CS.

The sensor driver 200C may drive the sensor layer 200. The sensor driver 200C may receive a control signal I-CS from the main driver 1000C. The control signal I-CS may include a mode determination signal and a clock signal for determining a driving mode of the sensor driver 200C.

The sensor driver 200C may calculate input coordinate information based on the signal received from the sensor layer 200 and provide a coordinate signal I-SS having coordinate information to the main driver 1000C. The main driver 1000C executes an operation corresponding to a user input based on the coordinate signal I-SS. For example, the main driver 1000C may operate the display driver 100C to display a new application image on the display layer 100.

The sensor driver 200C may provide the signal I-NS generated by the object (e.g., ear) 3000 spaced from the surface 1000SF of the electronic device 1000 to the main driver 1000C based on the signal received from the sensor layer 200. The separated object 3000 may be referred to as a hovering object. Although an ear of a user approaching the electronic device 1000 is shown as an example of the spaced object 3000, the spaced object may be a finger or another body part of a user.

The main driver 1000C may operate the display driver 100C to change (e.g., reduce) the luminance of the image displayed on the display layer 100, or not to display the image on the display layer 100, in response to the generated signal I-NS. In one embodiment, the main driver 1000C may turn off the display layer 100.

Also, in one embodiment, when it is determined that the object 3000 is detected, the main driver 1000C may enter a sleep mode. Even when the main driver 1000C enters the sleep mode, the sensor layer 200 and the sensor driver 200C may maintain their operations. Therefore, when the object 3000 is separated from the surface 1000SF of the electronic device 1000, the sensor driver 200C may determine this condition and provide a signal to the main driver 1000C for deactivating the sleep mode of the main driver 1000C.

Figure 3A:
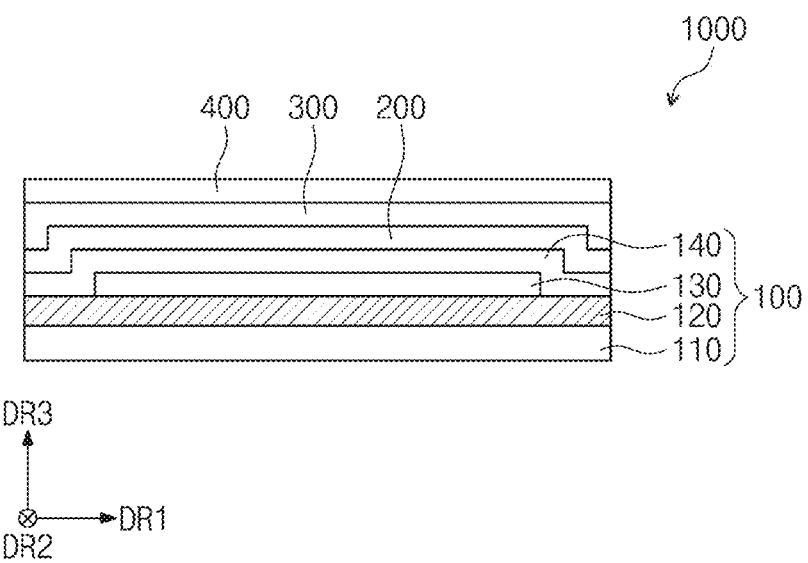
FIG. 3A is a cross-sectional view of an electronic device according to an embodiment of the inventive concept.

FIG. 3A is a cross-sectional view of an electronic device 1000 according to an embodiment of the inventive concept. Referring to FIG. 3A, an electronic device 1000 may include a display layer 100, a sensor layer 200, an anti-reflection layer 300, and a window 400.

The display layer 100 may include a base layer 110, a circuit layer 120, a light emitting element layer 130, and an encapsulation layer 140. The base layer 110 may provide a base surface on which the circuit layer 120 is disposed. The base layer 110 may be a glass substrate, a metal substrate, or a polymer substrate. However, the embodiment is not limited thereto, and the base layer 110 may be an inorganic layer, an organic layer, or a composite material layer.

The circuit layer 120 may be disposed on the base substrate 110. The circuit layer 120 may include an insulating layer, a semiconductor pattern, a conductive pattern, and a signal line. An insulating layer, a semiconductor layer, and a conductive layer are formed on the base layer 110 by a method such as coating and deposition. Thereafter, the insulating layer, the semiconductor layer, and the conductive layer may be selectively patterned through a plurality of photolithography processes. After that, a semiconductor pattern, a conductive pattern, and a signal line included in the circuit layer 120 may be formed.

The light emitting element layer 130 may be disposed on the circuit layer 120. The light emitting element layer 130 may include a light emitting element. For example, the light emitting element layer 130 may include an organic light emitting material, an inorganic light emitting material, an organic-inorganic light emitting material, a quantum dot, a quantum rod, a micro LED, or a nano LED.

The encapsulation layer 140 may be disposed on the light emitting element layer 130. The encapsulation layer 140 may protect the light emitting element layer 130 from foreign substances such as moisture, oxygen, and dust particles.

The sensor layer 200 may be disposed on the display layer 100. The sensor layer 200 may be formed on the display layer 100 through a continuous process. In this case, the sensor layer 200 may be expressed as being directly disposed on the display layer 100. In accordance with one or more embodiments, the term "directly disposed" may include the case where a component is not disposed between the sensor layer 200 and the display layer 100. For example, a separate adhesive member may not be disposed between the sensor layer 200 and the display layer 100. Alternatively, the sensor layer 200 may be coupled to the display layer 100 through an adhesive member. The adhesive member may include a adhesive or pressure-sensitive adhesive.

The anti-reflection layer 300 may be disposed on the sensor layer 200. The anti-reflection layer 300 may reduce reflectance of external light incident from the outside of the electronic device 1000. The anti-reflection layer 300 may be directly disposed on the sensor layer 200. However, the embodiment of the inventive concept is not limited thereto, and an adhesive member may be disposed between the anti-reflection layer 300 and the sensor layer 200.

The window 400 may be disposed on the anti-reflection layer 300. The window 400 may include an optically transparent insulating material. For example, the window 400 may include glass or plastic. The window 400 may have a multilayer structure or a single layer structure. For example, the window 400 may include a plurality of plastic films bonded with an adhesive, or may include a glass substrate and a plastic film bonded with an adhesive.

Figure 3B:
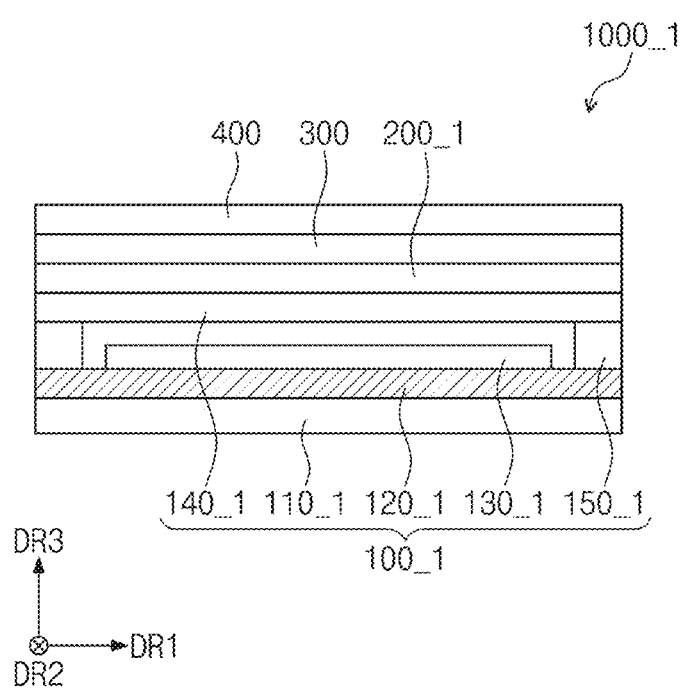
FIG. 3B is a cross-sectional view of an electronic device according to an embodiment of the inventive concept.

FIG. 3B is a cross-sectional view of an electronic device 1000_1 according to an embodiment of the inventive concept. Referring to FIG. 3B, the electronic device 1000_1 may include a display layer 100_1, a sensor layer 200_1, an anti-reflection layer 300, and a window 400.

The display layer 100_1 may include a base substrate 110_1, a circuit layer 120_1, a light emitting element layer 130_1, an encapsulation substrate 140_1, and a coupling member 150_1. Each of the base substrate 110_1 and the encapsulation substrate 140_1 may be a glass substrate, a metal substrate, or a polymer substrate, but is not particularly limited thereto.

The coupling member 150_1 may be disposed between the base substrate 110_1 and the encapsulation substrate 140_1. The coupling member 150_1 may couple the encapsulation substrate 140_1 to the base substrate 110_1 or the circuit layer 120_1. The coupling member 150_1 may include inorganic or organic materials. For example, the inorganic material may include a frit seal, and the organic material may include a photocurable resin or a photoplastic resin. However, the material constituting the coupling member 150_1 is not limited to the above example.

The sensor layer 200_1 may be directly disposed on the encapsulation substrate 140_1. In accordance with one or more embodiments, the term "directly disposed" may include the case where a component is not disposed between the sensor layer 200_1 and the encapsulation substrate 140_1. For example, a separate adhesive member may not be disposed between the sensor layer 200_1 and the display layer 100_1. However, the inventive concept is not limited thereto, and an adhesive layer may be further disposed between the sensor layer 200_1 and the encapsulation substrate 140_1.

Figure 4:
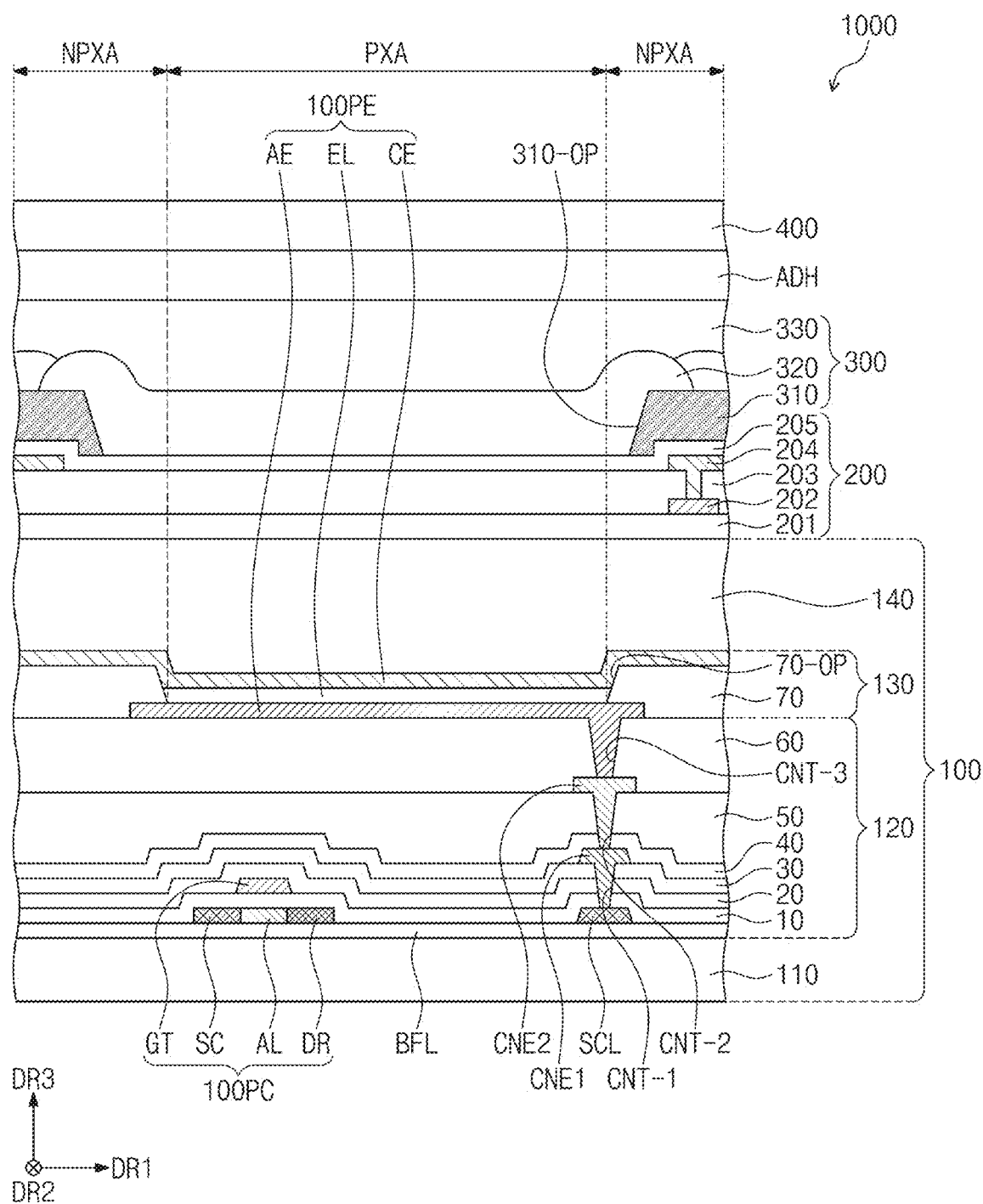
FIG. 4 is a cross-sectional view of an electronic device according to an embodiment of the inventive concept.

FIG. 4 is a cross-sectional view of the electronic device 1000 according to an embodiment of the inventive concept. Referring to FIG. 4, the electronic device 1000 may include a display layer 100, a sensor layer 200, an anti-reflection layer 300, an adhesive layer ADH, and a window 400. The adhesive layer ADH may be disposed between the anti-reflection layer 300 and the window 400. The adhesive layer ADH may include an adhesive or pressure-sensitive adhesive having light transmission properties.

At least one inorganic layer is formed on the upper surface of the base layer 110. For example, the inorganic layer may include at least one of aluminum oxide, titanium oxide, silicon oxide, silicon nitride, silicon oxynitride, zirconium oxide, or hafnium oxide. The inorganic layer may be formed in multiple layers. The multi-layered inorganic layers may constitute a barrier layer and/or a buffer layer. In this embodiment, the display layer 100 is shown to include the buffer layer BFL.

The buffer layer BFL may improve bonding force between the base layer 110 and the semiconductor pattern. The buffer layer BFL may include at least one of silicon oxide, silicon nitride, or silicon oxynitride. For example, the buffer layer BFL may include a structure in which a silicon oxide layer and a silicon nitride layer are alternately stacked.

The semiconductor pattern may be disposed on the buffer layer BFL. The semiconductor pattern may include poly-silicon. However, the embodiment of the inventive concept is not limited thereto, and the semiconductor pattern may include amorphous silicon, low-temperature polycrystalline silicon, or an oxide semiconductor.

FIG. 4 illustrates only some semiconductor patterns with the understanding that semiconductor patterns may be further disposed in other areas. The semiconductor pattern(s) may be arranged in a specific rule across the pixels. Semiconductor patterns may have different electrical properties depending on whether they are doped or not. For example, the semiconductor pattern may include a first area having high conductivity and a second area having low conductivity. The first area may be doped with an N-type dopant or a P-type dopant. A P-type transistor may include a doping area doped with a P-type dopant, and an N-type transistor may include a doping area doped with an N-type dopant. The second area may be a non-doped area or an area doped with a lower concentration than the first area.

The conductivity of the first area is greater than that of the second area, and may substantially serve as an electrode or a signal line. The second area may substantially correspond to an active area (or channel) of the transistor. For example, part of the semiconductor pattern may be an active area of the transistor, another part may be a source or drain of the transistor, and another part may be a connection electrode or a connection signal line.

In one embodiment, each of the pixels may have an equivalent circuit including seven transistors, one capacitor, and a light emitting element. The equivalent circuit diagram of the pixel may be modified in various forms. Each of the pixels may have a different structure in other embodiments. In FIG. 4, one transistor 100PC and a light emitting element 100PE included in a pixel are illustrated as an example.

The source area SC, the active area AL, and the drain area DR of the transistor 100PC may be formed from a semiconductor pattern. The source area SC and the drain area DR may extend in opposite directions from the active area AL on a cross section. FIG. 4 illustrates part of a connection signal line SCL formed from a semiconductor pattern. The connection signal line SCL may be connected to the drain area DR of the transistor 100PC on a plane.

The first insulating layer 10 may be disposed on the buffer layer BFL. The first insulating layer 10 may overlap a plurality of pixels in common and cover a semiconductor pattern. The first insulating layer 10 may be an inorganic layer and/or an organic layer, and may have a single layer or multilayer structure. The first insulating layer 10 may include, for example, at least one of aluminum oxide, titanium oxide, silicon oxide, silicon nitride, silicon oxynitride, zirconium oxide, or hafnium oxide. In this embodiment, the first insulating layer 10 may be a single-layer silicon oxide layer. In addition to the first insulating layer 10, the insulating layer of the circuit layer 120 (to be described later) may be an inorganic layer and/or an organic layer, and may have a single layer or multilayer structure. The inorganic layer may include at least one of the above-mentioned materials, but is not limited thereto.

The gate GT of the transistor 100PC is disposed on the first insulating layer 10. The gate GT may be a part of the metal pattern. The gate GT overlaps the active area AL. In the process of doping the semiconductor pattern, the gate GT may function as a mask.

The second insulating layer 20 is disposed on the first insulating layer 10 and may cover the gate GT. The second insulating layer 20 may overlap the pixels in common. The second insulating layer 20 may be an inorganic layer and/or an organic layer, and may have a single layer or multilayer structure. The second insulating layer 20 may include at least one of silicon oxide, silicon nitride, or silicon oxynitride. In this embodiment, the second insulating layer 20 may have a multilayer structure including a silicon oxide layer and a silicon nitride layer.

The third insulating layer 30 may be disposed on the second insulating layer 20. The third insulating layer 30 may have a single layer or multilayer structure. For example, the third insulating layer 30 may have a multilayer structure including a silicon oxide layer and a silicon nitride layer.

The first connection electrode CNE1 may be disposed on the third insulating layer 30. The first connection electrode CNE1 may be connected to the connection signal line SCL through the contact hole CNT-1 passing through the first, second, and third insulating layers 10, 20, and 30.

The fourth insulating layer 40 may be disposed on the third insulating layer 30. The fourth insulating layer 40 may be a single layer of silicon oxide. The fifth insulating layer 50 may be disposed on the fourth insulating layer 40. The fifth insulating layer 50 may be an organic layer.

The second connection electrode CNE2 may be disposed on the fifth insulating layer 50. The second connection electrode CNE2 may be connected to the first connection electrode CNE1 through a contact hole CNT-2 penetrating the fourth insulating layer 40 and the fifth insulating layer 50.

The sixth insulating layer 60 is disposed on the fifth insulating layer 50 and may cover the second connection electrode CNE2. The sixth insulating layer 60 may be an organic layer.

The light emitting element layer 130 may be disposed on the circuit layer 120. The light emitting element layer 130 may include a light emitting element 100PE. For example, the light emitting element layer 130 may include an organic light emitting material, an inorganic light emitting material, an organic-inorganic light emitting material, a quantum dot, a quantum rod, a micro LED, or a nano LED. Hereinafter, a description will be given that the light emitting element 100PE is an organic light emitting element, but is not particularly limited thereto.

The light emitting element 100PE may include a first electrode AE, a light emitting layer EL, and a second electrode CE. The first electrode AE may be disposed on the sixth insulating layer 60. The first electrode AE may be connected to the second connection electrode CNE2 through a contact hole CNT-3 penetrating through the sixth insulating layer 60.

The pixel defining film 70 is disposed on the sixth insulating layer 60 and may cover a portion of the first electrode AE. An opening part 70-OP is defined in the pixel defining film 70. The opening part 70-OP of the pixel defining film 70 exposes at least a portion of the first electrode AE.

The active area 1000A (e.g., see FIG. 1) may include an emission area PXA and a non-emission area NPXA adjacent to the emission area PXA. The non-emission area NPXA may partially or completely surround the emission area PXA. In this embodiment, the emission area PXA is defined to correspond to a partial area of the first electrode AE exposed by the opening part 70-OP.

The light emitting layer EL may be disposed on the first electrode AE. The light emitting layer EL may be disposed in an area corresponding to the opening part 70-OP. For example, the light emitting layer EL may be formed separately on each of the pixels. When the light emitting layer EL is formed separately on each of the pixels, each of the light emitting layers EL may emit light of at least one color, e.g., blue, red, or green. However, the embodiment of the inventive concept is not limited thereto, and the light emitting layer EL may be connected to the pixels and included in common. In this case, the light emitting layer EL may provide blue light or white light.

The second electrode CE may be disposed on the light emitting layer EL. The second electrode CE has an integral shape and may be commonly included in a plurality of pixels.

A hole control layer may be disposed between the first electrode AE and the light emitting layer EL. The hole control layer may be commonly disposed in the emission area PXA and the non-emission area NPXA. The hole control layer may include a hole transport layer and may further include a hole injection layer. An electron control layer may be disposed between the light emitting layer EL and the second electrode CE. The electron control layer may include an electron transport layer and may further include an electron injection layer. The hole control layer and the electron control layer may be commonly formed in a plurality of pixels using an open mask or an inkjet process.

The encapsulation layer 140 may be disposed on the light emitting element layer 130. In one embodiment, the encapsulation layer 140 may include an inorganic layer, an organic layer, and an inorganic layer sequentially stacked, but the layers constituting the encapsulation layer 140 may be different in other embodiments. The inorganic layer may protect the light emitting element layer 130 from moisture and oxygen, and the organic layer may protect the light emitting element layer 130 from foreign substances such as dust particles. The inorganic layers may include a silicon nitride layer, a silicon oxynitride layer, a silicon oxide layer, a titanium oxide layer, or an aluminum oxide layer. The organic layer may include an acrylic organic layer, but is not limited thereto.

The sensor layer 200 may include a base layer 201, a first conductive layer 202, a detection insulating layer 203, a second conductive layer 204, and a cover insulating layer 205. The base layer 201 may be an inorganic layer including at least one of silicon nitride, silicon oxynitride, or silicon oxide. Alternatively, the base layer 201 may be an organic layer including an epoxy resin, an acrylic resin, or an imide resin. The base layer 201 may have a single layer structure or may have a multilayer structure stacked along the third direction DR3.

Each of the first conductive layer 202 and the second conductive layer 204 may have a single layer structure or may have a multilayer structure stacked along the third direction DR3. The single-layered conductive layer may include a metal layer or a transparent conductive layer. For example, the metal layer may include molybdenum, silver, titanium, copper, aluminum, or an alloy thereof. The transparent conductive layer may include a transparent conductive oxide such as, but not limited to, indium tin oxide (ITO), indium zinc oxide (IZO), zinc oxide (ZnO), indium zinc tin oxide (IZTO), or the like. In addition, the transparent conductive layer may include a conductive polymer such as poly(3,4-ethylenedioxythiophene) (PEDOT), metal nanowires, graphene, and the like.

The multilayered conductive layer may include metal layers. In one embodiment, the metal layers may have a three-layer structure of, for example, titanium/aluminum/titanium. The multilayered conductive layer may include at least one metal layer and at least one transparent conductive layer.

At least one of the detection insulating layer 203 and the cover insulating layer 205 may include an inorganic film. The inorganic film may include at least one of aluminum oxide, titanium oxide, silicon oxide, silicon nitride, silicon oxynitride, zirconium oxide, or hafnium oxide.

At least one of the detection insulating layer 203 and the cover insulating layer 205 may include an organic film. The organic film may include at least one of acrylic resin, methacrylic resin, polyisoprene, vinyl resin, epoxy resin, urethane resin, cellulose resin, siloxane resin, polyimide resin, polyamide resin, or perylene resin.

The anti-reflection layer 300 may be disposed on the sensor layer 200. The anti-reflection layer 300 may include a partition layer 310, a plurality of color filters 320, and a planarization layer 330. The partition layer 310 may overlap the conductive pattern of the second conductive layer 204. The cover insulating layer 205 may be disposed between the partition layer 310 and the second conductive layer 204. In another embodiment of the inventive concept, the cover insulating layer 205 may be omitted.

The partition layer 310 may prevent reflection of external light by the second conductive layer 204. The material constituting the partition layer 310 is not particularly limited as long as it is a material that absorbs light. The partition layer 310 has a black color. In an embodiment, the partition layer 310 may include a black coloring agent. The black coloring agent may include, for example, a black dye and a black pigment. The black component may include a metal such as carbon black or chromium, or an oxide thereof.

A partition opening 310-OP may be defined in the partition layer 310. The partition opening 310-OP may overlap the light emitting layer EL. The color filter 320 may be disposed to correspond to the partition opening 310-OP. The color filter 320 may transmit light provided from the light emitting layer EL overlapping the color filter 320.

The planarization layer 330 may cover the partition layer 310 and the color filter 320. The planarization layer 330 may include an organic material, and may provide a flat surface on the upper surface of the planarization layer 330. In one embodiment, the planarization layer 330 may be omitted.

In an embodiment of the inventive concept, the anti-reflection layer 300 may include a reflection adjustment layer instead of the color filters 320. For example, in the illustration of FIG. 4, the color filters 320 may be omitted and a reflection adjustment layer may be added in the place where the color filters 320 are omitted. The reflection adjustment layer may selectively absorb light of a partial band among light reflected from the inside of the display panel and/or the electronic device, or light incident from outside of the display panel and/or the electronic device.

As an example, the reflection adjustment layer absorbs a first wavelength region (e.g., 490 nm to 505 nm) and a second wavelength region (e.g., 585 nm to 600 nm), so that the light transmittance in the first wavelength region and the second wavelength region may be in a predetermined range, e.g., 40% or less. The reflection adjustment layer may absorb light having a wavelength that lies out of the wavelength ranges corresponding to red, green, and blue light emitted from the light emitting layer EL. As such, the reflection adjustment layer absorbs light of a wavelength that does not belong to the wavelength range of red, green, or blue emitted from the light emitting layer EL. As a result, decrease in luminance of the display panel and/or the electronic device may be prevented or minimized. In addition, reduction in emission efficiency of the display panel and/or electronic device may be prevented or minimized at the same time, and visibility may be improved.

The reflection adjustment layer may be provided as an organic material layer including a dye, a pigment, or a combination thereof. The reflection adjustment layer may include a tetraazaporphyrin (TAP)-based compound, porphyrin-based compound, a metal porphyrin-based compound, an oxazine-based compound, a squarylium-based compound, a triarylmethane-based compound, a polymethine-based compound, a traquinone-based compound, a phthalocyanine-based compound, an azo-based compound, a perylene-based compound, a xanthene-based compound, a diimmonium-based compound, a dipyrromethene-based compound, a cyanine-based compound, or combinations thereof.

In one embodiment, the reflection adjustment layer may have a predetermined transmittance, e.g., lying in a range of about 64% to about 72%. The reflection adjustment layer may have a different transmittance in another embodiment. The transmittance of the reflection adjustment layer may be adjusted, for example, according to the content of pigments and/or dyes included in the reflection adjustment layer.

Figure 5:
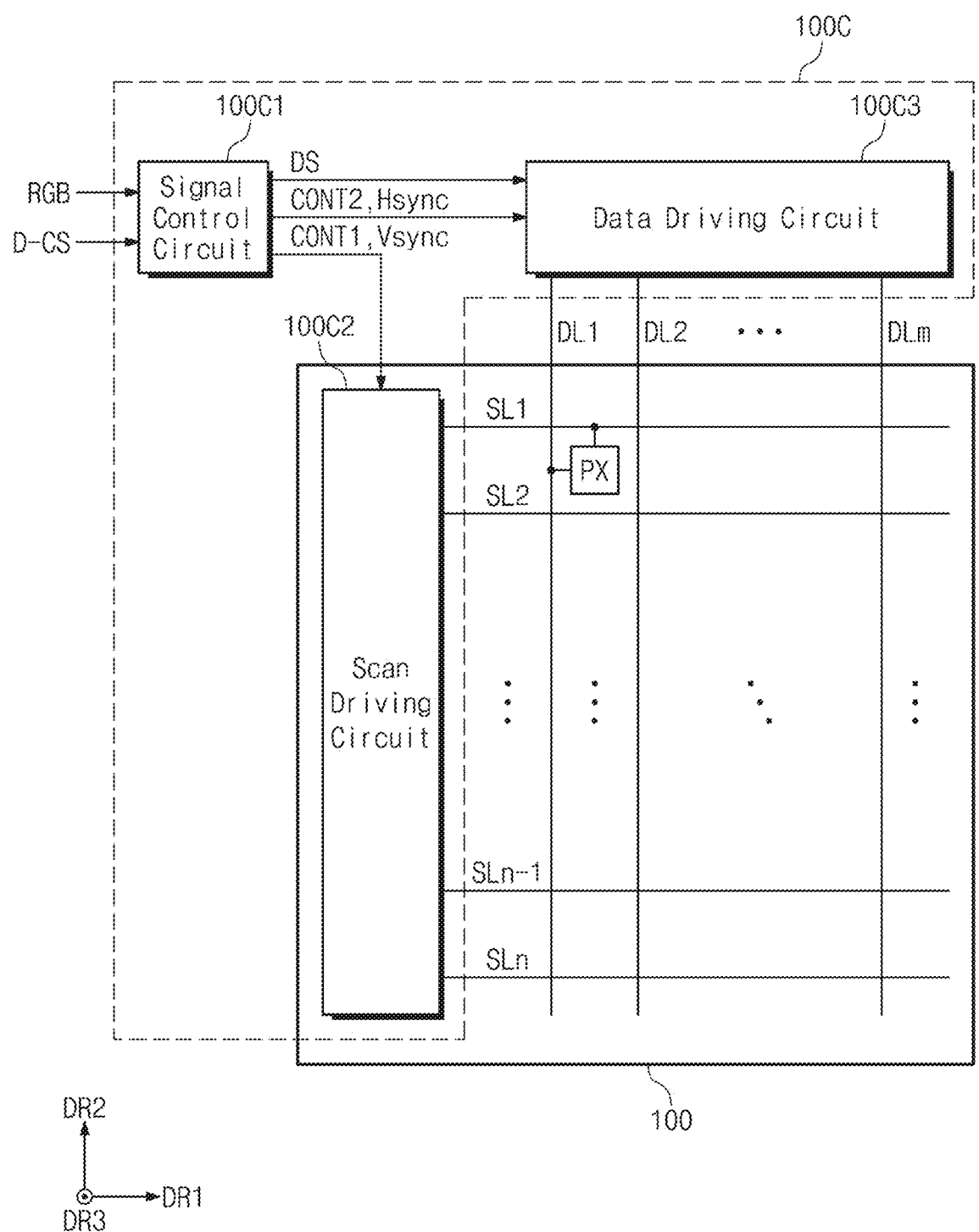
FIG. 5 is a block diagram of a display layer and a display driver according to an embodiment of the inventive concept.

FIG. 5 is a block diagram of the display layer 100 and the display driver 100C according to an embodiment of the inventive concept.

Referring to FIG. 5, the display layer 100 may include a plurality of scan lines SL1 to SLn, a plurality of data lines DL1 to DLm, and a plurality of pixels PX. Each of the pixels PX is connected to a corresponding data line among the data lines DL1 to DLm and is connected to a corresponding scan line among the scan lines SL1 to SLn. Herein, n may be an integer of 2 or more, and m may be an integer of 2 or more. In an embodiment of the inventive concept, the display layer 100 may further include emission control lines, and the display driver 100C may further include an emission driving circuit providing control signals to the emission control lines. The configuration of the display layer 100 is not particularly limited.

Each of the scan lines SL1 to SLn may extend along the first direction DR1, and the scan lines SL1 to SLn may be arranged spaced apart from each other in the second direction DR2. Each of the data lines DL1 to DLm may extend along the second direction DR2, and the data lines DL1 to DLm may be arranged spaced apart from each other in the first direction DR1.

The display driver 100C may include a signal control circuit 100C1, a scan driving circuit 100C2, and a data driving circuit 100C3. The signal control circuit 100C1 may receive image data RGB and a control signal D-CS from the main driver 1000C (e.g., see FIG. 2). The control signal D-CS may include various signals. For example, the control signal D-CS may include an input vertical synchronization signal, an input horizontal synchronization signal, a main clock, and a data enable signal.

The signal control circuit 100C1 may generate a first control signal CONT1 and a vertical synchronization signal Vsync based on the control signal D-CS, and output the first control signal CONT1 and the vertical synchronization signal Vsync to the scan driving circuit 100C2.

The signal control circuit 100C1 may generate a second control signal CONT2 and a horizontal synchronization signal Hsync based on the control signal D-CS, and output the second control signal CONT2 and the horizontal synchronization signal Hsync to the data driving circuit 100C3.

Also, the signal control circuit 100C1 may output a driving signal DS obtained by processing the image data RGB according to the operating condition of the display layer 100 to the data driving circuit 100C3. The first control signal CONT1 and the second control signal CONT2 are signals used for the operation of the scan driving circuit 100C2 and the data driving circuit 100C3 and are not particularly limited.

The scan driving circuit 100C2 drives the plurality of scan lines SL1 to SLn in response to the first control signal CONT1 and the vertical synchronization signal Vsync. In an embodiment of the inventive concept, the scan driving circuit 100C2 may be formed by the same process as the circuit layer 120 (e.g., see FIG. 4) in the display layer 100, but is not limited thereto. For example, the scan driving circuit 100C2 may be implemented as an integrated circuit (IC) to be directly mounted on a predetermined area of the display layer 100 or may be mounted on a separate printed circuit board in a chip-on-film (COF) method to be electrically connected to the display layer 100.

The data driving circuit 100C3 may output a grayscale voltage through the data lines DL1 to DLm in response to the second control signal CONT2, the horizontal synchronization signal Hsync, and the driving signal DS from the signal control circuit 100C1. The data driving circuit 100C3 may be implemented as an IC to be directly mounted on a predetermined area of the display layer 100 or may be mounted on a separate printed circuit board in a chip-on-flex (COF) method to be electrically connected to the display layer 100 but the inventive concept is not particularly limited thereto. For example, the data driving circuit 100C3 may be formed by the same process as the circuit layer 120 (e.g., see FIG. 4) in the display layer 100.

Figure 6:
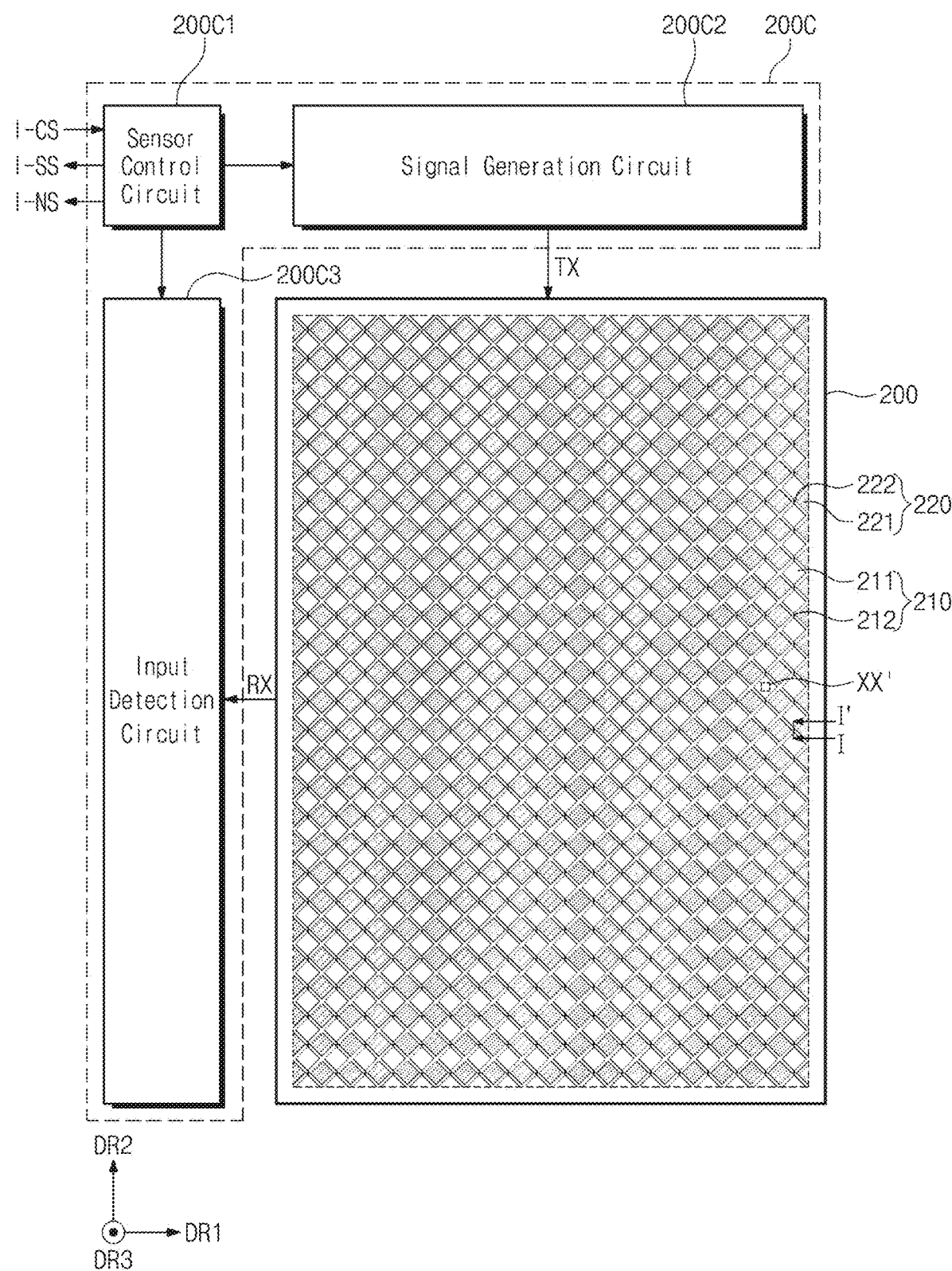
FIG. 6 is a block diagram of a sensor layer and a sensor driver according to an embodiment of the inventive concept.

FIG. 6 is a block diagram of the sensor layer 200 and a sensor driver 200C according to an embodiment of the inventive concept.

Referring to FIG. 6, the sensor layer 200 may include a plurality of first electrodes 210 and a plurality of second electrodes 220. The plurality of second electrodes 220 may cross the plurality of first electrodes 210, respectively. The sensor layer 200 may further include a plurality of signal lines connected to the plurality of first electrodes 210 and the plurality of second electrodes 220.

Each of the plurality of first electrodes 210 may extend along the second direction DR2, and the plurality of first electrodes 210 may be arranged spaced apart from each other in the first direction DR1. Each of the plurality of second electrodes 220 may extend along the first direction DR1, and the plurality of second electrodes 220 may be arranged spaced apart from each other in the second direction DR2. Although 18 first electrodes 210 and 27 second electrodes 220 are illustratively shown in FIG. 6, the number of first electrodes 210 and the number of second electrodes 220 may be different in another embodiment.

Each of the plurality of first electrodes 210 may include a detection pattern 211 and a bridge pattern 212. The two detection patterns 211 adjacent to each other may be electrically connected to each other by the two bridge patterns 212, but are not particularly limited thereto. The detection pattern 211 may be included in the second conductive layer 204 (e.g., see FIG. 4), and the bridge pattern 212 may be included in the first conductive layer 202 (e.g., see FIG. 4).

Each of the plurality of second electrodes 220 may include a first part 221 and a second part 222. The first part 221 and the second part 222 may have an integral shape with each other, and may be disposed on the same layer. For example, the first part 221 and the second part 222 may be included in the second conductive layer 204 (e.g., see FIG. 4). The two bridge patterns 212 may cross the second part 222. The first part 221 may be referred to as a detection part, and the second part 222 may be referred to as a connection part. In one embodiment, the detection pattern 211 may be referred to as a first detection pattern, the bridge pattern 212 may be referred to as a first bridge pattern, the first part 221 may be referred to as a second detection pattern, and the second part 222 may be referred to as a second bridge pattern.

The sensor driver 200C may selectively operate in a first mode (or a touch sensing mode) or a second mode different from the first mode (referred to as a proximity sensing mode). The sensor driver 200C may receive the control signal I-CS from the main driver 1000C (e.g., see FIG. 2). In the first mode, the sensor driver 200C may provide the coordinate signal I-SS to the main driver 1000C (e.g., see FIG. 2). In the second mode, the sensor driver 200C may provide a signal I-NS generated by a spaced object 3000 (e.g., see FIG. 2) to the main driver 1000C (e.g., see FIG. 2).

The sensor driving circuit 200C may be implemented as an integrated circuit (IC) to be directly mounted on a predetermined area of the sensor layer 200 or may be mounted on a separate printed circuit board in a chip-on-film (COF) method to be electrically connected to the sensor layer 200.

The sensor driver 200C may include a sensor control circuit 200C1, a signal generation circuit 200C2, and an input detection circuit 200C3. The sensor control circuit 200C1 may control operation of the signal generation circuit 200C2 and the input detection circuit 200C3 based on the control signal I-CS.

The signal generation circuit 200C2 may output transmission signals TX to the first electrodes 210 of the sensor layer 200. The transmission signals TX may have at least one parameter which is controlled (e.g., changed or hopped) in accordance with the embodiments described herein. As will be discussed in greater detail below, the parameter may be at least one of the frequency or phase of the transmission signals. The input detection circuit 200C3 may receive detection signals RX from the sensor layer 200. For example, the input detection circuit 200C3 may receive detection signals RX from the second electrodes 220.

The input detection circuit 200C3 may convert an analog signal into a digital signal. For example, the input detection circuit 200C3 amplifies and filters the received analog signal, e.g., the input detection circuit 200C3 may convert the filtered signal into a digital signal.

Figure 7A:
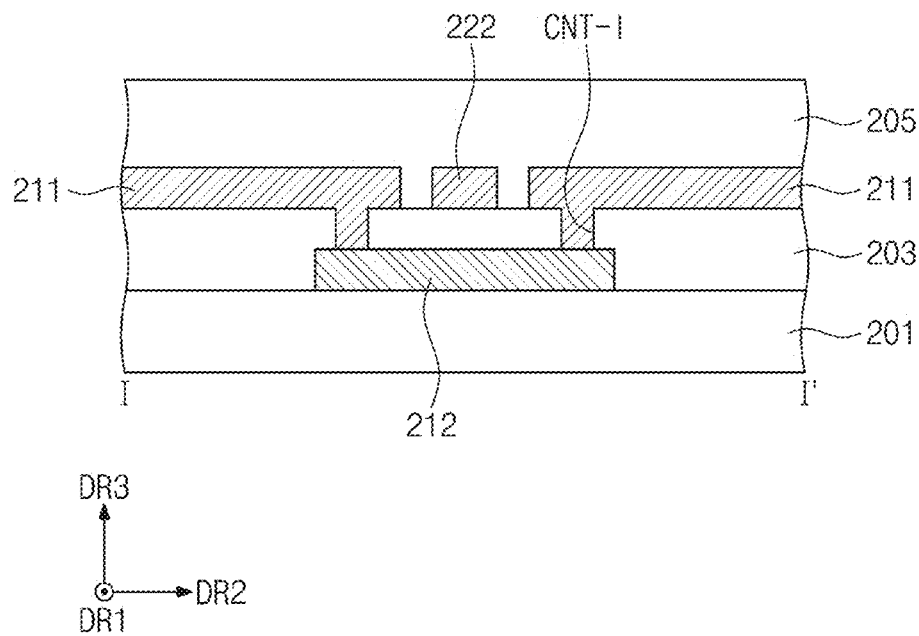
FIG. 7A is a cross-sectional view of a sensor layer according to an embodiment of the inventive concept taken along line I-I' shown in FIG. 6.

FIG. 7A is a cross-sectional view of the sensor layer 200 according to an embodiment of the inventive concept taken along line I-I' shown in FIG. 6.

Referring to FIGS. 6 and 7A, the sensor layer 200 may have a bottombridge structure. For example, the bridge pattern 212 may be included in the first conductive layer 202 (e.g., see FIG. 4), and the first part 221, the second part 222, and the detection pattern 211 may be included in the second conductive layer 204 (e.g., see FIG. 4). The detection pattern 211 may be connected to the bridge pattern 212 through the contact hole CNT-I penetrating the detection insulating layer 203.

Figure 7B:
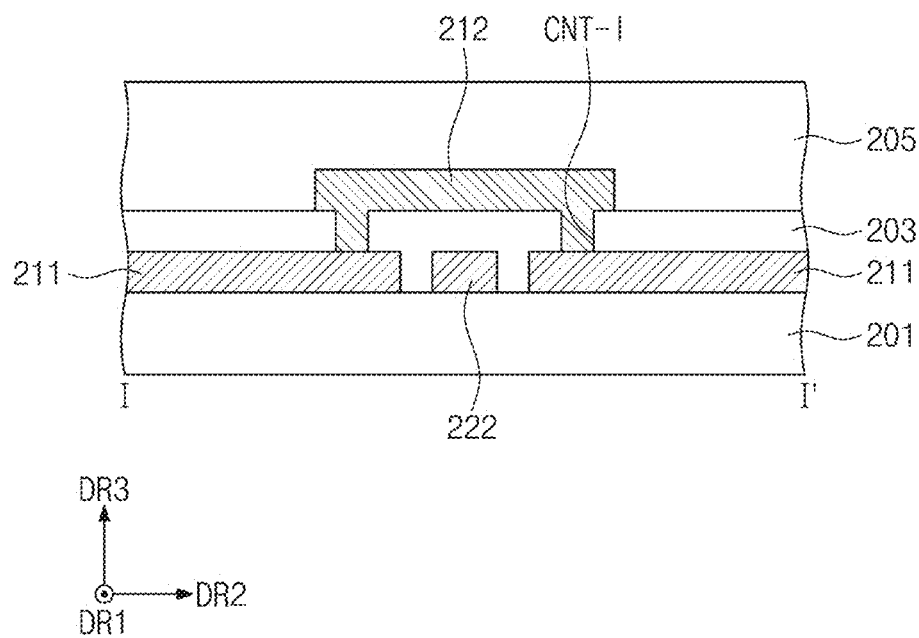
FIG. 7B is a cross-sectional view of the sensor layer according to an embodiment of the inventive concept taken along line I-I' shown in FIG. 6.

FIG. 7B is a cross-sectional view of the sensor layer according to another embodiment of the inventive concept taken along line I-I' shown in FIG. 6.

Referring to FIGS. 6 and 7B, the sensor layer 200 may have a topbridge structure. For example, the bridge pattern 212 may be included in the second conductive layer 204 (e.g., see FIG. 4), and the first part 221, the second part 222, and the detection pattern 211 may be included in the first conductive layer 202 (e.g., see FIG. 4). The bridge pattern 212 may be connected to the detection pattern 211 through the contact hole CNT-I penetrating the detection insulating layer 203.

Figure 8:
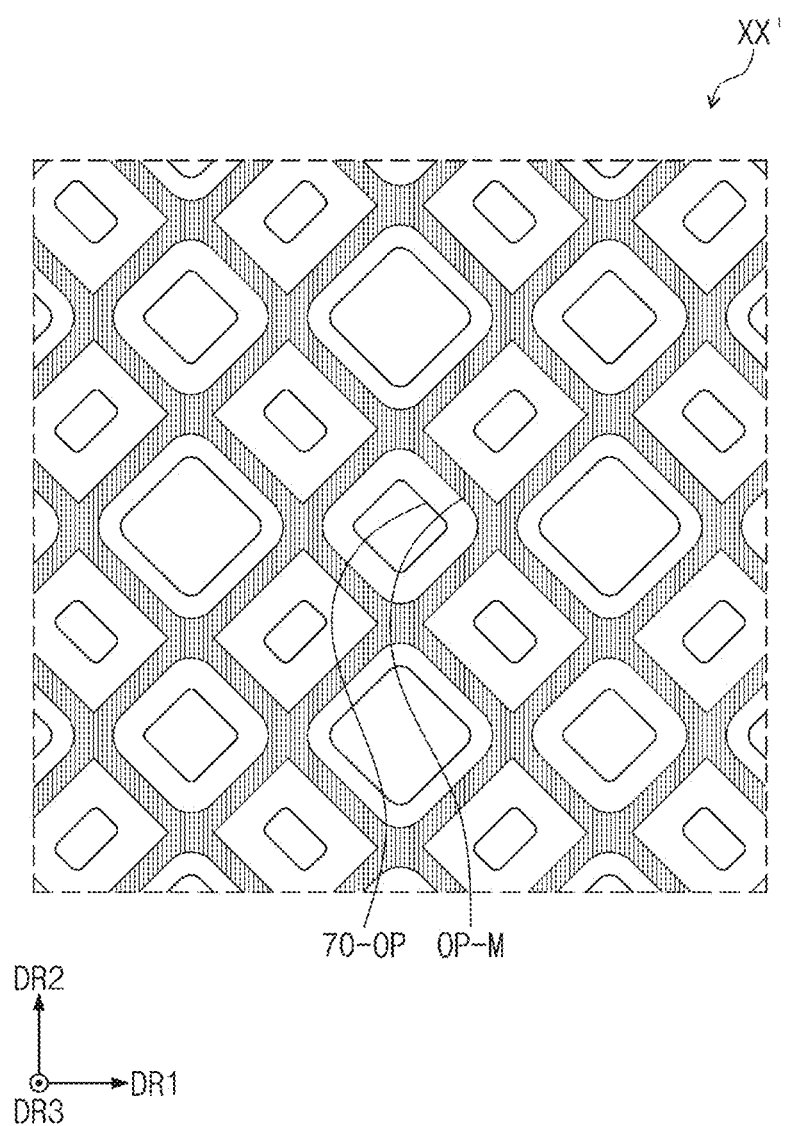
FIG. 8 is an enlarged plan view of an area XX' shown in FIG. 6.

FIG. 8 is an enlarged plan view of an area XX' shown in FIG. 6.

Referring to FIGS. 6 and 8, the detection pattern 211 may have a predetermined structure, for example, a mesh structure. An opening OP-M may be defined in the detection pattern 211. One opening OP-M may overlap the opening part 70-OP defined in the pixel defining film 70 (e.g., see FIG. 4). However, this is only an example, and one opening OP-M may overlap a plurality of opening parts 70-OP in other embodiments. Each of the bridge pattern 212, first part 221, and second part 222 may have a mesh structure similar to that of the detection pattern 211.

Figure 9:
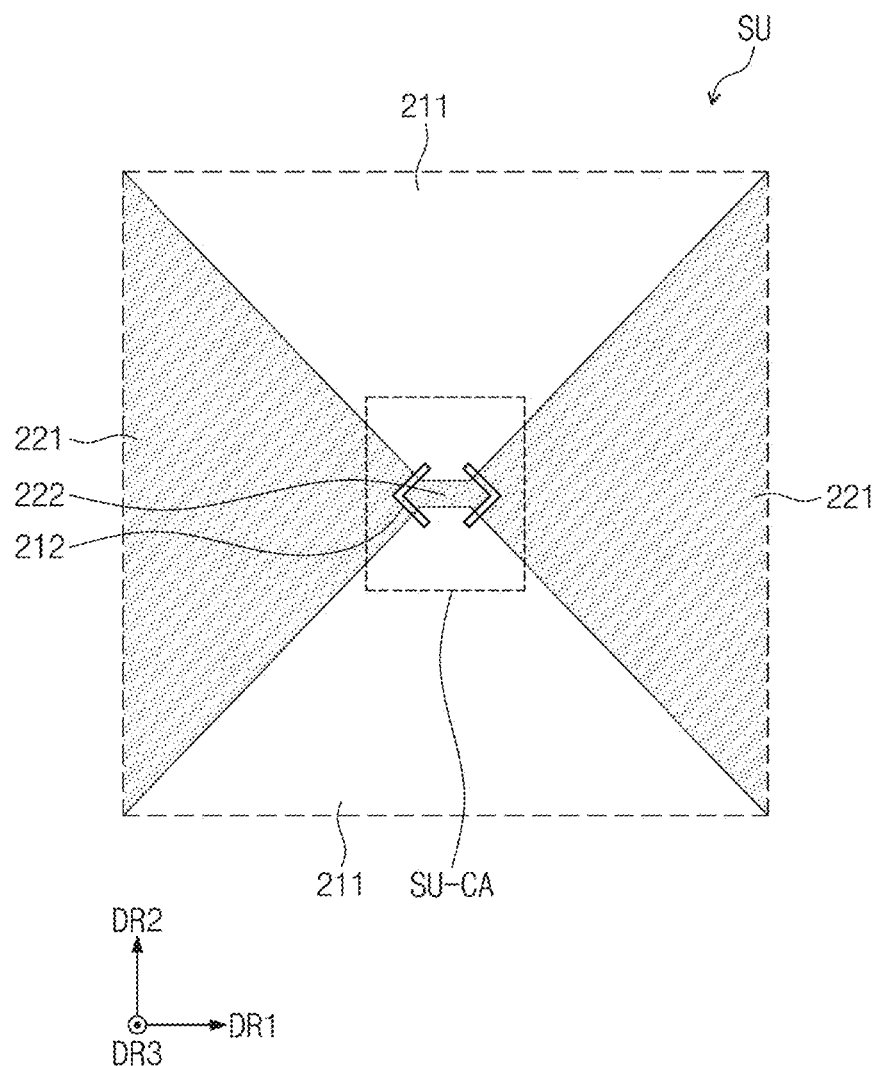
FIG. 9 is a plan view of a sensing unit according to an embodiment of the inventive concept.
Figure 10:
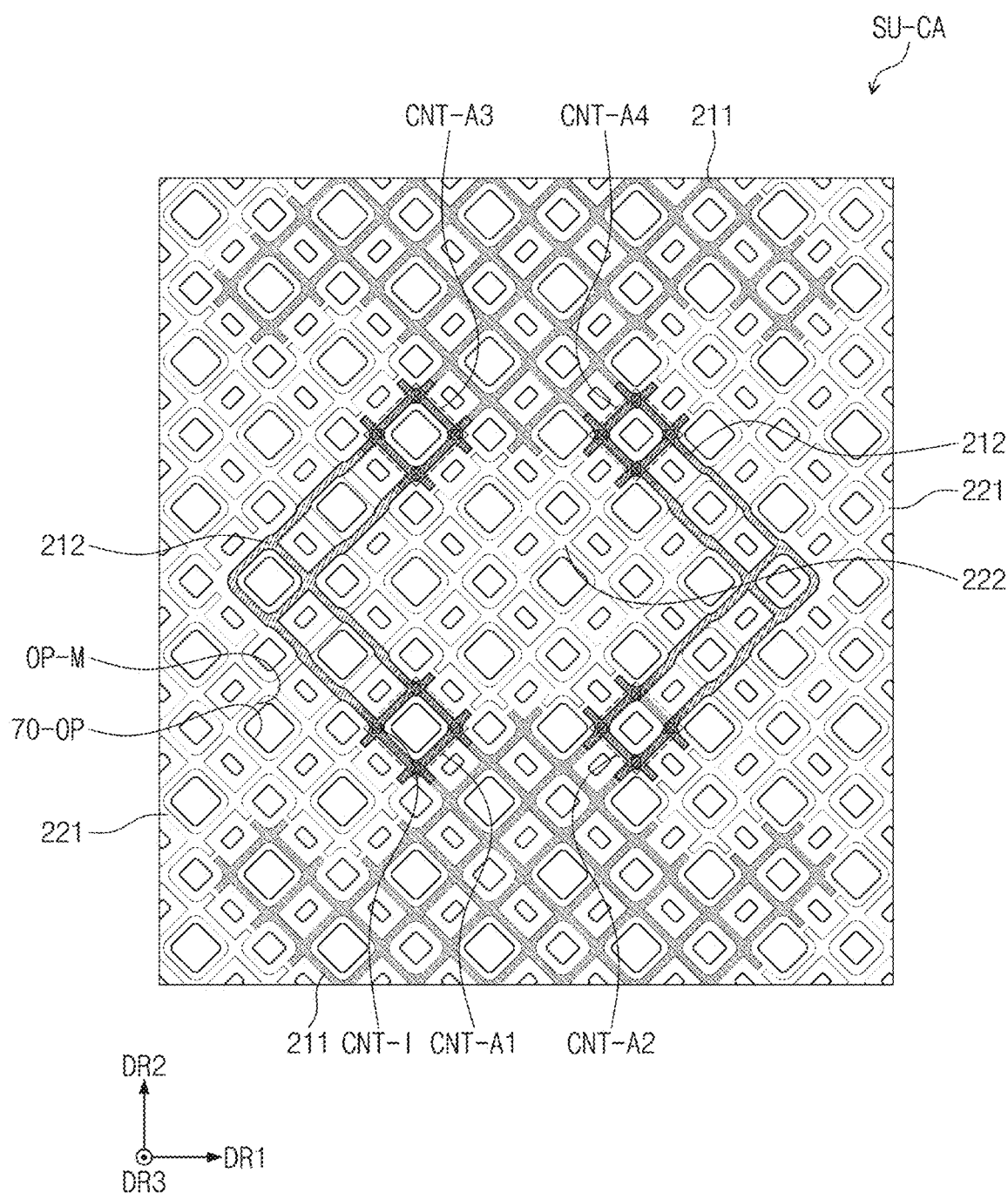
FIG. 10 is an enlarged plan view of an intersection area of sensing units according to an embodiment of the inventive concept.

FIG. 9 is a plan view of the sensing unit SU according to an embodiment of the inventive concept. FIG. 10 is an enlarged plan view of an intersection area of sensing units SU according to an embodiment of the inventive concept.

Referring to FIGS. 6, 9, and 10, the sensor layer 200 may be divided into a plurality of sensing units SU. Each of the sensing units SU may include a corresponding intersection area among intersection areas of the first electrodes 210 and the second electrodes 220. The intersection area may be an area where the bridge patterns 212 are disposed.

The sensing unit SU may include half of the first part 221, the second part 222, the other half of the first part 221 disposed with the second part 222 therebetween, half of the detection pattern 211, two bridge patterns 212, and the other half of the detection pattern 211.

Two bridge patterns 212 may connect two detection patterns 211. First to fourth connection areas CNT-A1 to CNT-A4 are provided between the two bridge patterns 212 and the two detection patterns 211. Four contact holes CNT-I may be formed in the first to fourth connection areas CNT-A1 to CNT-A4, respectively. However, this is only an example, and two detection patterns 211 may be electrically connected by one bridge pattern in another embodiment. Also, in another embodiment of the inventive concept, two detection patterns 211 may be electrically connected by three or more bridge patterns.

Figure 11A:
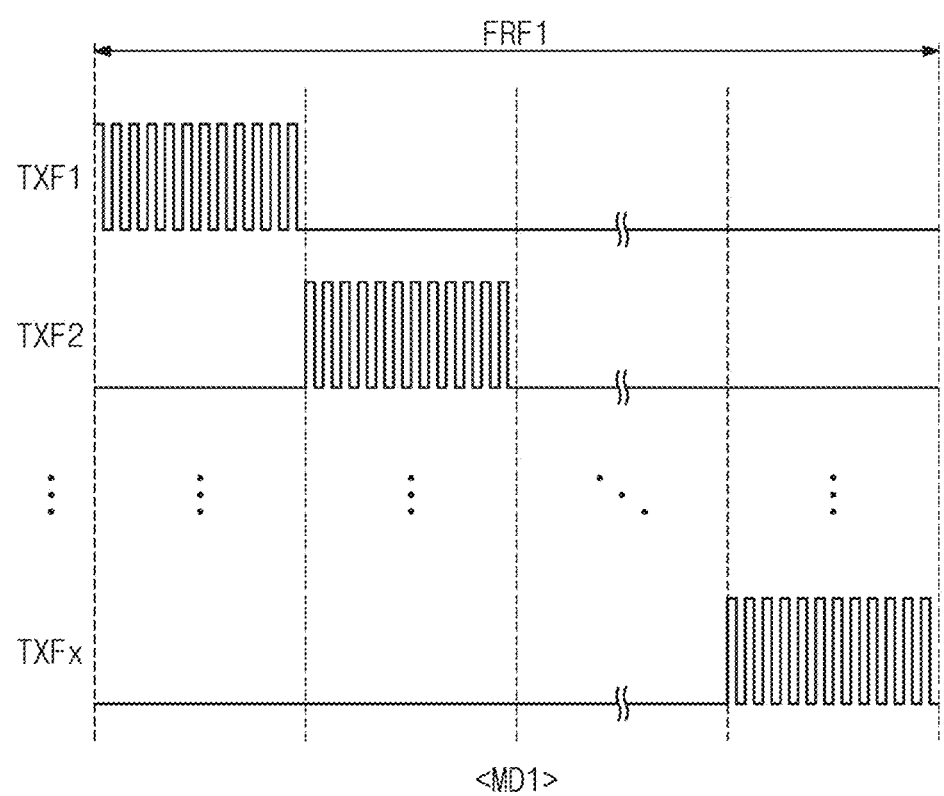
FIG. 11A is a waveform diagram of transmission signals according to an embodiment of the inventive concept.

FIG. 11A is a waveform diagram of transmission signals according to an embodiment of the inventive concept.

Referring to FIGS. 6 and 11A, the sensor driver 200C may operate in the first mode MD1. The first mode MD1 is a touch sensing mode, and the sensor control circuit 200C1 may generate the coordinate signal I-SS using the digital signal. The report rate (or frame frequency) in the first mode MD1 may be higher than the report rate in the second mode MD2 (e.g., see FIG. 12A). For example, the report rate in the first mode MD1 may be 240 Hz, but is not particularly limited thereto. Also, in the first mode MD1, the report rate may be variable in one embodiment.

FIG. 11A illustrates transmission signals TXF1, TXF2, . . . , TXFx corresponding to one frame FRF1 when the sensor layer 200 defines a time unit for detecting an input as a frame. Herein, x may be an integer of 3 or greater. Transmission signals TXF1, TXF2, . . . , TXFx may be provided to the first electrodes 210, respectively. Accordingly, the number of transmission signals TXF1, TXF2, . . . , TXFx may be equal to or greater than the number of first electrodes 210. In this case, within one frame FRF1, the transmission signals TXF1, TXF2, . . . , TXFx may be sequentially activated. The activation state may correspond, for example, to a state in which the transmission signals TXF1, TXF2, . . . , TXFx swing between predetermined voltage sections. As an example, the frequency of each of the transmission signals TXF1, TXF2, . . . , TXFx may be hundreds of kHz, but is not particularly limited thereto.

Figure 11B:
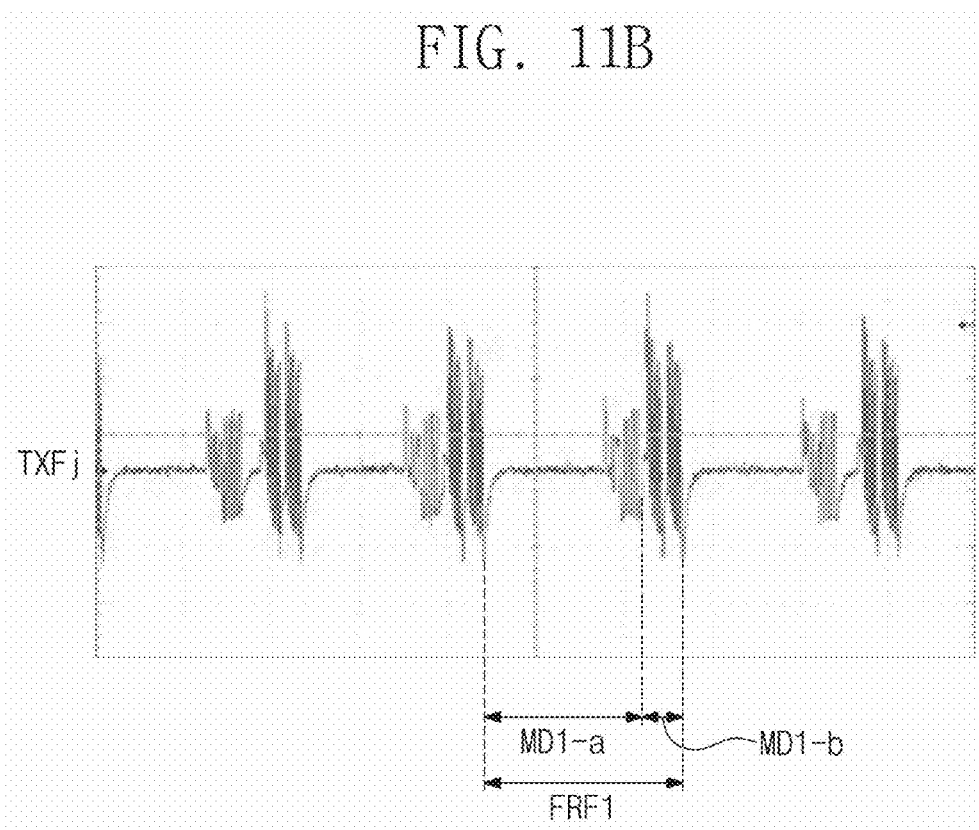
FIG. 11B is a waveform diagram of one transmission signal according to an embodiment of the inventive concept.

FIG. 11B is a waveform diagram of one transmission signal TXFj according to an embodiment of the inventive concept.

Referring to FIGS. 11A and 11B, the transmission signal TXFj may be one of transmission signals TXF1, TXF2, . . . , TXFx. Herein, j may be an integer greater than or equal to 1 and less than or equal to x. One frame FRF1 may include a first sensing section MD1-*a* and a second sensing section MD1-*b*. For example, the first sensing section MD1-*a* may be a mutual-cap sensing section, and the second sensing section MD1-*b* may be a self-cap sensing section.

In the first sensing section MD1-*a*, the sensor driver 200C may detect the amount of change in mutual capacitance formed between the first electrode 210 and the second electrode 220, and in the second sensing section MD1-*b*, the sensor driver 200C may detect a capacitance variation of each of the first electrodes 210. Also, in one embodiment of the inventive concept, transmission signals may be provided to the second electrodes 220 in the second sensing section MD1-*b*. In FIG. 11B, one frame FRF1 has been described as including both the first sensing section MD1-*a* and the second sensing section MD1-*b* as an example, but is not particularly limited thereto. For example, one frame FRF1 may include only the first sensing section MD1-*a* or only the second sensing section MD1-*b*.

Figure 12A:
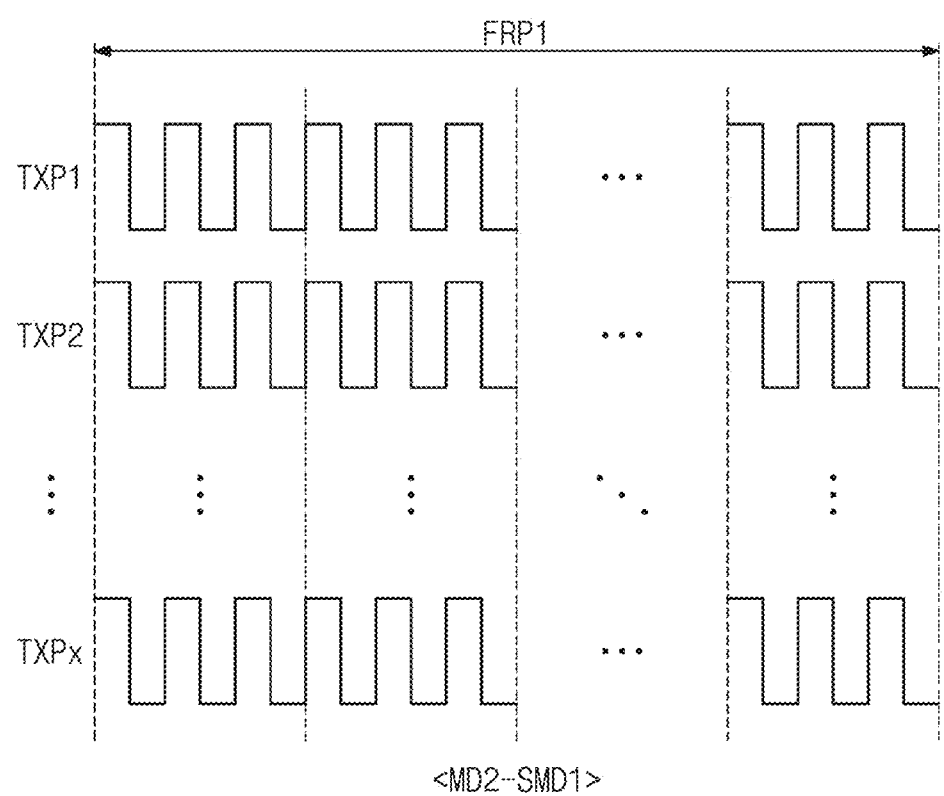
FIG. 12A is a waveform diagram of transmission signals according to an embodiment of the inventive concept.

FIG. 12A is a waveform diagram of transmission signals according to an embodiment of the inventive concept.

Referring to FIGS. 6 and 12A, the sensor driver 200C may operate in the second mode MD2. The second mode MD2 may be a proximity sensing mode, and the sensor driver 200C may generate a signal I-NS generated by the spaced object 3000 (e.g., see FIG. 2).

The report rate (or frame frequency) in the second mode MD2 may be different from (lower than) the report rate in the first mode MD1 (e.g., see FIG. 11A). For example, the report rate in the second mode MD2 may be 60 Hz, but is not particularly limited thereto. Because the report rate in the proximity sensing mode is relatively lower, a sensing distance of the object 3000 may be increased. In addition, because a change in capacitance generated when the object 3000 approaches increases, the object 3000 may be more easily detected. Thus, the proximity sensing performance of the electronic device 1000 (e.g., see FIG. 1) may be further improved.

Figure 13A:
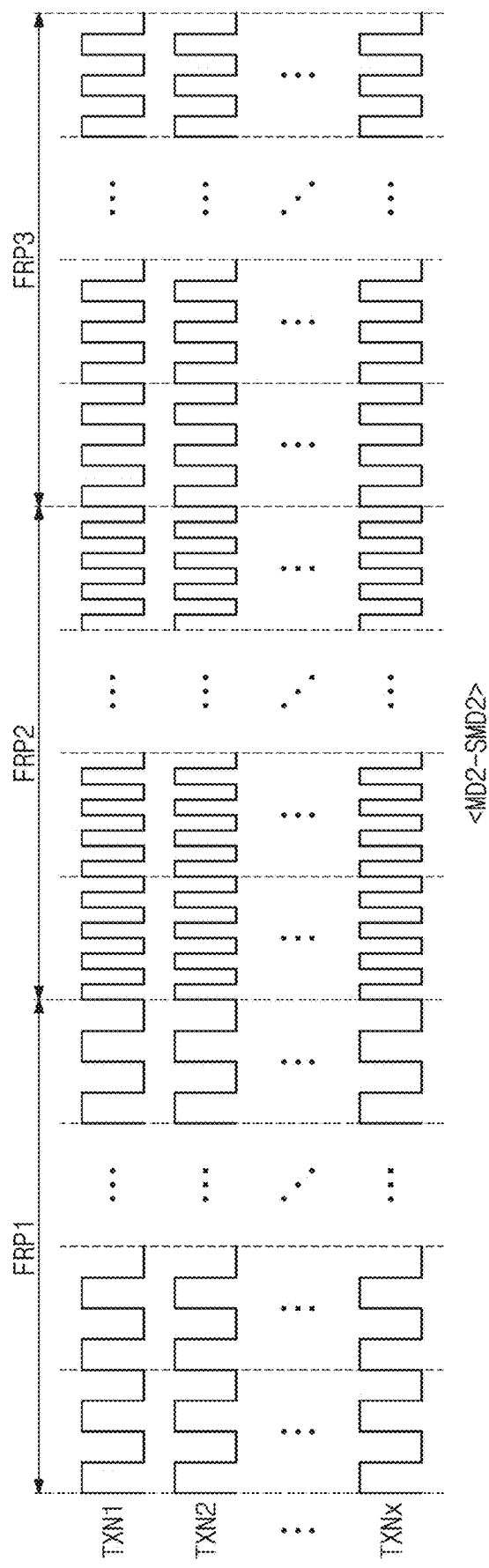
FIG. 13A is a waveform diagram of transmission signals according to an embodiment of the inventive concept.

In the second mode MD2, the sensor driver 200C may be driven in the first driving mode SMD1 or the second driving mode SMD2 (e.g., see FIG. 13A). In FIG. 12A, the first driving mode SMD1 is described. The report rate in the first driving mode SMD1 may be 60 Hz, but is not particularly limited thereto.

FIG. 12A illustrates the first transmission signals TXP1, TXP2, . . . , TXPx corresponding to one frame FRP1 when the sensor layer 200 defines a time unit for detecting an input as a frame. Herein, x may be an integer of 3 or greater. The first transmission signals TXP1, TXP2, . . . , TXPx may be provided to the first electrodes 210, respectively.

The sensor driver 200C may simultaneously output the first transmission signals TXP1, TXP2, . . . , TXPx to the first electrodes 210. For example, the first transmission signals TXP1, TXP2, . . . , TXPx may have a one-to-one correspondence with the first electrodes 210. Waveforms of the first transmission signals TXP1, TXP2, . . . , TXPx may be identical to each other, and the first transmission signals TXP1, TXP2, . . . , TXPx may be signals of the same phase.

By comparison, the frequency of each of the first transmission signals TXP1, TXP2, . . . , TXPx may be lower than the frequency of each of the transmission signals TXF1, TXF2, . . . , TXFx described with reference to FIG. 11A. For example, the frequency of each of the first transmission signals TXP1, TXP2, . . . , TXPx may be tens of kHz or more and one hundred and several tens of kHz or less, but is not particularly limited thereto.

According to an embodiment of the inventive concept, because the first transmission signals TXP1, TXP2, . . . , TXPx of the same phase are simultaneously provided to the first electrodes 210 in the first driving mode SMD1, the strength of a signal for detecting the object 3000 may be increased. Accordingly, the signal-to-noise ratio of the detection signal RX may be increased. Accordingly, a proximity sensing recognition distance (or an object recognizable height) may be increased. While signal strength for detecting the object 3000 is favored in this case, additional embodiments described below favor other performance aspects of the electronic device, such as flicker reduction when operating in the second mode (or second driving mode as will become apparent below).

Figure 12B:
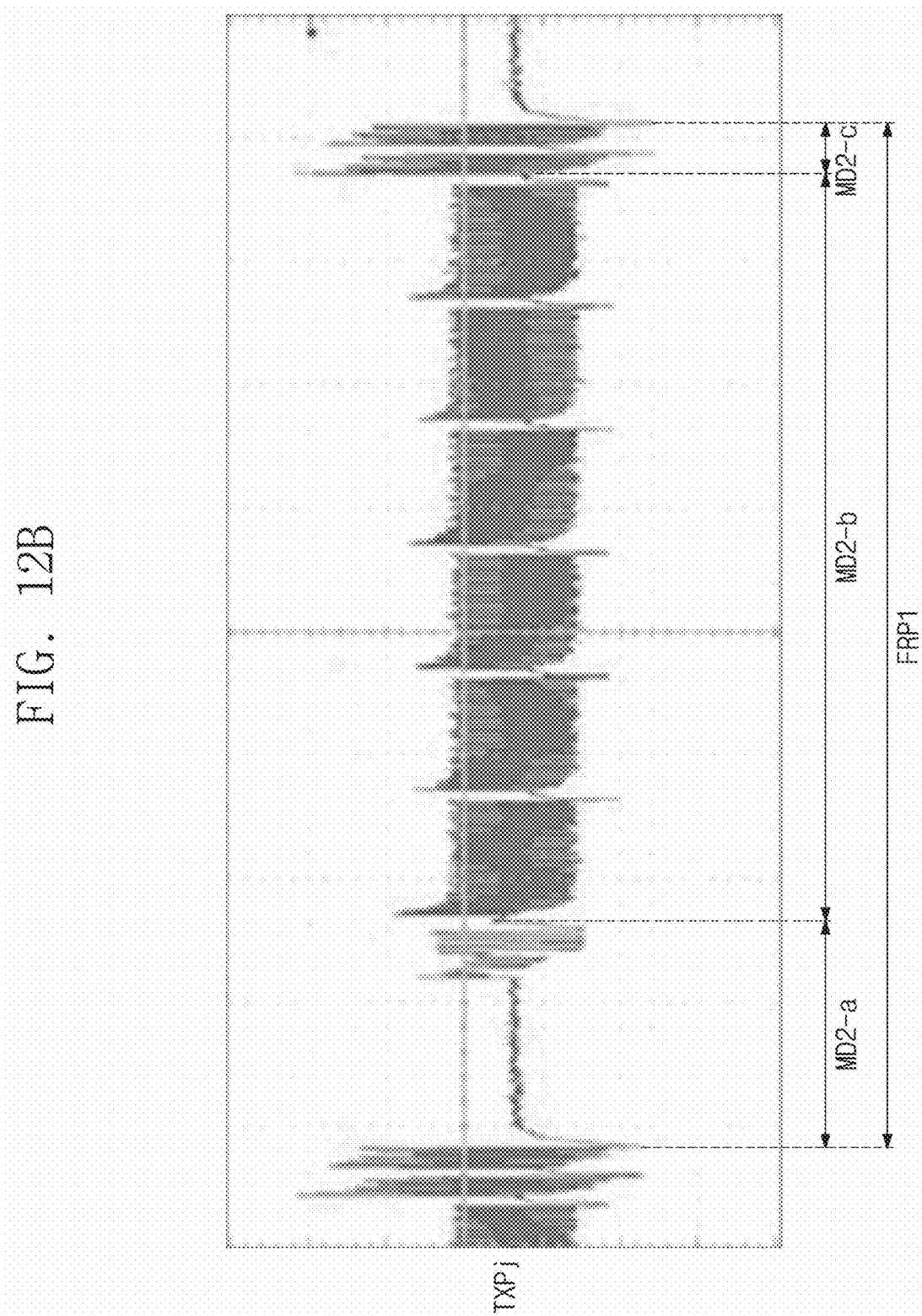
FIG. 12B is a waveform diagram of one transmission signal according to an embodiment of the inventive concept.

FIG. 12B is a waveform diagram of one transmission signal according to an embodiment of the inventive concept.

Referring to FIGS. 6 and 12B, a first transmission signal TXPj may be a signal provided to one of the first electrodes 210 in the first driving mode SMD1 (see FIG. 12A). In one embodiment of the inventive concept, one frame FRP1 may include a first sensing section MD2-*a*, a second sensing section MD2-*b*, and a third sensing section MD2-*c*. For example, the first sensing section MD2-*a* may be a mutual-cap sensing section, the second sensing section MD2-*b* may be a proximity sensing section, and the third sensing section MD2-*c* may be a self-cap sensing section. Accordingly, the first transmission signal TXPj of the same phase and the same waveform may be simultaneously provided to the first electrodes 210 in the second sensing section MD2-*b*.

In one embodiment of the inventive concept, one frame FRP1 may include only the second sensing section MD2-*b*, may include only the first sensing section MD2-*a* and the second sensing section MD2-*b*, or may include the second sensing section MD2-*b* and the third sensing section MD2-*c*. For example, if one frame FRP1 includes the second sensing section MD2-*b* in the first driving mode SMD1 (e.g., see FIG. 12A), it may be modified into various examples.

Figure 13B:
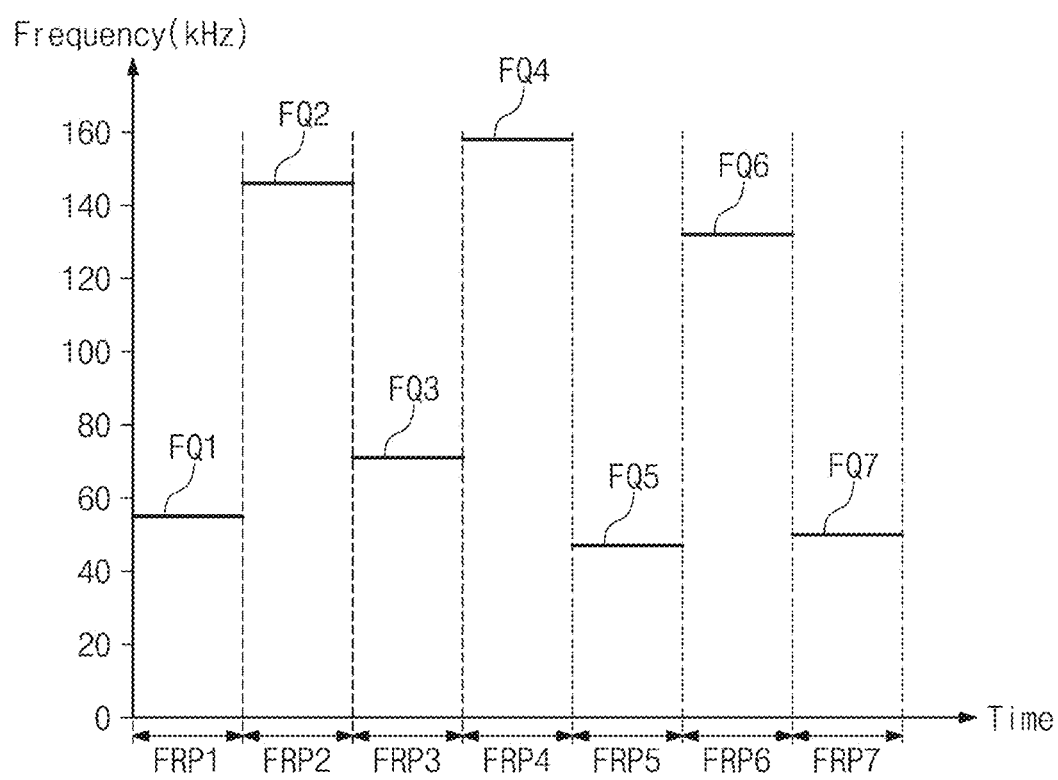
FIG. 13B is a graph illustrating a frequency change of one transmission signal in a proximity sensing mode according to an embodiment of the inventive concept.

FIG. 13A is a waveform diagram of transmission signals according to an embodiment of the inventive concept. FIG. 13B is a graph illustrating a frequency change of one transmission signal in a proximity sensing mode according to an embodiment of the inventive concept.

Referring to FIGS. 6, 13A, and 13B, in the second mode MD2, the sensor driver 200C may be driven in the first driving mode SMD1 (e.g., see FIG. 12A) or the second driving mode SMD2. FIG. 13A describes the second driving mode SMD2. In the second driving mode SMD2, the report rate may be the same as that of the first driving mode SMD1. For example, the report rate in the second driving mode SMD2 may be 60 Hz, but is not particularly limited thereto. In one embodiment of the inventive concept, the report rate in the second driving mode SMD2 may be different from that in the first driving mode SMD1.

FIG. 13A illustrates second transmission signals TXN1, TXN2, . . . , TXNx corresponding to three frames FRP1, FRP2, and FRP3 when the sensor layer 200 defines a time unit for detecting an input as a frame. Herein, x may be an integer of 3 or greater. The second transmission signals TXN1, TXN2, . . . , TXNx may be provided to the first electrodes 210, respectively. Accordingly, the number of second transmission signals TXN1, TXN2, . . . , TXNx may be greater than or equal to the number of first electrodes 210.

The sensor driver 200C may simultaneously output the second transmission signals TXN1, TXN2, ..., TXNx to the first electrodes 210. For example, the second transmission signals TXN1, TXN2, ..., TXNx may have a one-to-one correspondence with the first electrodes 210.

In one embodiment of the inventive concept, waveforms of the second transmission signals TXN1, TXN2, ..., TXNx may be identical to each other, and the second transmission signals TXN1, TXN2, ..., TXNx may be signals of the same phase. However, the frequency of the second transmission signals may differ across different frames, as will now be described.

The second transmission signals TXN1, TXN2, ..., TXNx may be different from the first transmission signals TXP1, TXP2, ..., TXPx described with reference to FIG. 11A. For example, if each of the first transmission signals TXP1, TXP2, ..., TXPx has a predetermined fixed frequency, the frequency of each of the second transmission signals TXN1, TXN2, ..., TXNx may be changed, or hopped, over a predetermined time period. In one embodiment of the inventive concept, the frequency of each of the second transmission signals TXN1, TXN2, ..., TXNx may be hopped every frame, e.g., the second transmission signals TXN1, TXN2, ..., TXNx may have a first frequency in a first frame and a different frequency (lesser or greater) in a second frame, as will now be described.

Referring to FIG. 13B, a graph shows a frequency change of one second transmission signal among second transmission signals TXN1, TXN2, ..., TXNx. For example, the first to seventh frequencies FQ1, FQ2, FQ3, FQ4, FQ5, FQ6, and FQ7 corresponding to a total of seven consecutive frames FRP1, FRP2, FRP3, FRP4, FRP5, FRP6, and FRP7 are displayed. The first frequency FQ1 may be 55 kHz, the second frequency FQ2 may be 146 kHz, the third frequency FQ3 may be 71 kHz, the fourth frequency FQ4 may be 158 kHz, the fifth frequency FQ5 may be 47 kHz, the sixth frequency FQ6 may be 132 kHz, and the seventh frequency FQ7 may be 50 kHz, but the embodiment of the inventive concept is not particularly limited thereto.

In a frequency band of one hundred and several tens of kHz or less, a band with a risk of causing noise in the display layer 100 (e.g., see FIG. 4) may be included. If a transmission signal having a (fixed) frequency of a risky band is continuously provided to the sensor layer 200, this may cause a flicker phenomenon in an image displayed on the display layer 100. According to an embodiment of the inventive concept, when a specific event (e.g., entering an environment relatively vulnerable to flicker) occurs, the sensor layer 200 may operate in the second driving mode SMD2 among the second modes MD2. In the second driving mode SMD2, the frequency of each of the second transmission signals TXN1, TXN2, ..., TXNx may be changed (or hopped) every time period, which in this case is every frame. Therefore, the probability of causing noise in the display layer 100 may be reduced compared to the case where the frequency is fixed at a specific frequency for every frame. Accordingly, proximity sensing performance of the electronic device 1000 (e.g., see FIG. 1) may be improved, and also image quality may be improved.

Figure 14:
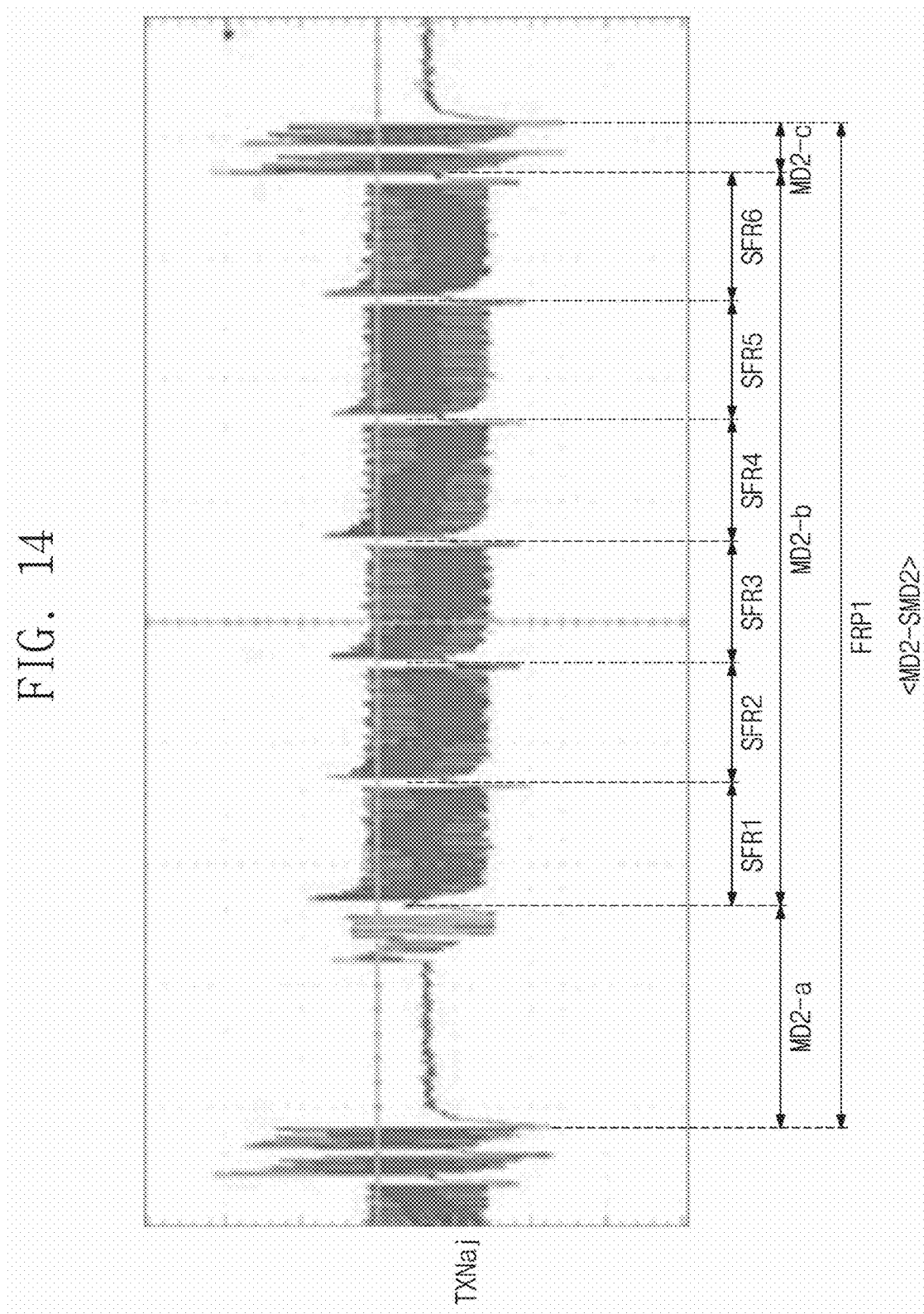
FIG. 14 is a waveform diagram of one transmission signal according to an embodiment of the inventive concept.

FIG. 14 is a waveform diagram of one transmission signal according to an embodiment of the inventive concept.

Referring to FIGS. 6 and 14, a second transmission signal TXNaj may be provided to one of the first electrodes 210 in the second driving mode SMD2. Since the second transmission signal TXNaj of the same phase and the same waveform is provided to the first electrodes 210 in the second drive mode SMD2, descriptions of the remaining second transmission signals are omitted.

In one embodiment of the inventive concept, one frame FRP1 may include a first sensing section MD2-a, a second sensing section MD2-b, and a third sensing section MD2-c. In one embodiment of the inventive concept, one frame FRP1 may include only the second sensing section MD2-b, include only the first sensing section MD2-a and the second sensing section MD2-b, or include the second sensing section MD2-b and the third sensing section MD2-c. For example, if one frame FRP1 in the second driving mode SMD2 includes the second sensing section MD2-b, it may be modified into various examples.

The second sensing section MD2-b may include a plurality of sub frames SFR1, SFR2, SFR3, SFR4, SFR5, and SFR6. In FIG. 14, the second sensing section MD2-b includes six sub frames SFR1, SFR2, SFR3, SFR4, SFR5, and SFR6 as an example, but is not particularly limited thereto. The sub frames SFR1, SFR2, SFR3, SFR4, SFR5, and SFR6 may also be referred to as a transmission unit.

Figure 15A:
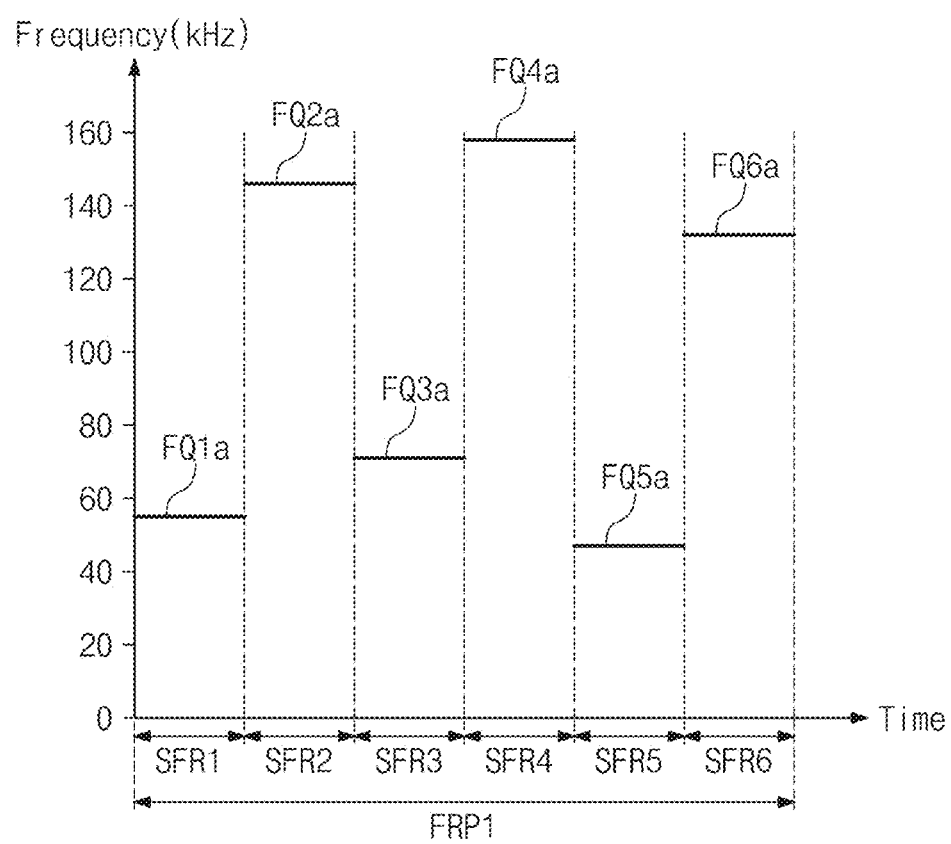
FIG. 15A is a graph illustrating a frequency change of one transmission signal in a proximity sensing mode according to an embodiment of the inventive concept.

FIG. 15A is a graph illustrating a frequency change (hopping) of one transmission signal when the electronic device is operating in a proximity sensing mode according to an embodiment of the inventive concept.

Referring to FIGS. 14 and 15A, the frequency of the second transmission signal TXNaj may be hopped (e.g., changed) within one frame FRP1. For example, the frequency of the second transmission signal TXNaj may be hopped across the sub frames SFR1, SFR2, SFR3, SFR4, SFR5, and SFR6 included in one frame FRP1. Thus, in this embodiment, frequency hopping intervals within one frame FRP1 may be equal to each other. In one embodiment, the hopped frequencies may all be different from one another among the sub frames. In another embodiment, at least two of the frequencies that are hopped may be the same.

FIG. 15A shows first to sixth frequencies FQ1a, FQ2a, FQ3a, FQ4a, FQ5a, and FQ6a (all of which are different from one another) corresponding to a total of six consecutive sub frames SFR1, SFR2, SFR3, SFR4, SFR5, and SFR6. The first frequency FQ1a may be 55 kHz, the second frequency FQ2a may be 146 kHz, the third frequency FQ3a may be 71 kHz, the fourth frequency FQ4a may be 158 kHz, the fifth frequency FQ5a may be 47 kHz, and the sixth frequency FQ6a may be 132 kHz, but the embodiment of the inventive concept is not particularly limited thereto.

According to an embodiment of the inventive concept, when a specific event (e.g., entering an environment relatively vulnerable to flicker) occurs, the sensor layer 200 may operate in the second driving mode SMD2 of the second mode MD2. In the second driving mode SMD2, the frequency of the second transmission signal TXNaj may be changed (or hopped) multiple times within one frame FRP1. Therefore, the probability of causing noise in the display layer 100 may be reduced compared to the case where the second transmission signal TXNaj is fixed to a specific frequency across all sub frames of the frame. Accordingly, proximity sensing performance of the electronic device 1000 (see FIG. 1) may be improved, and also image quality may be improved.

Figure 15B:
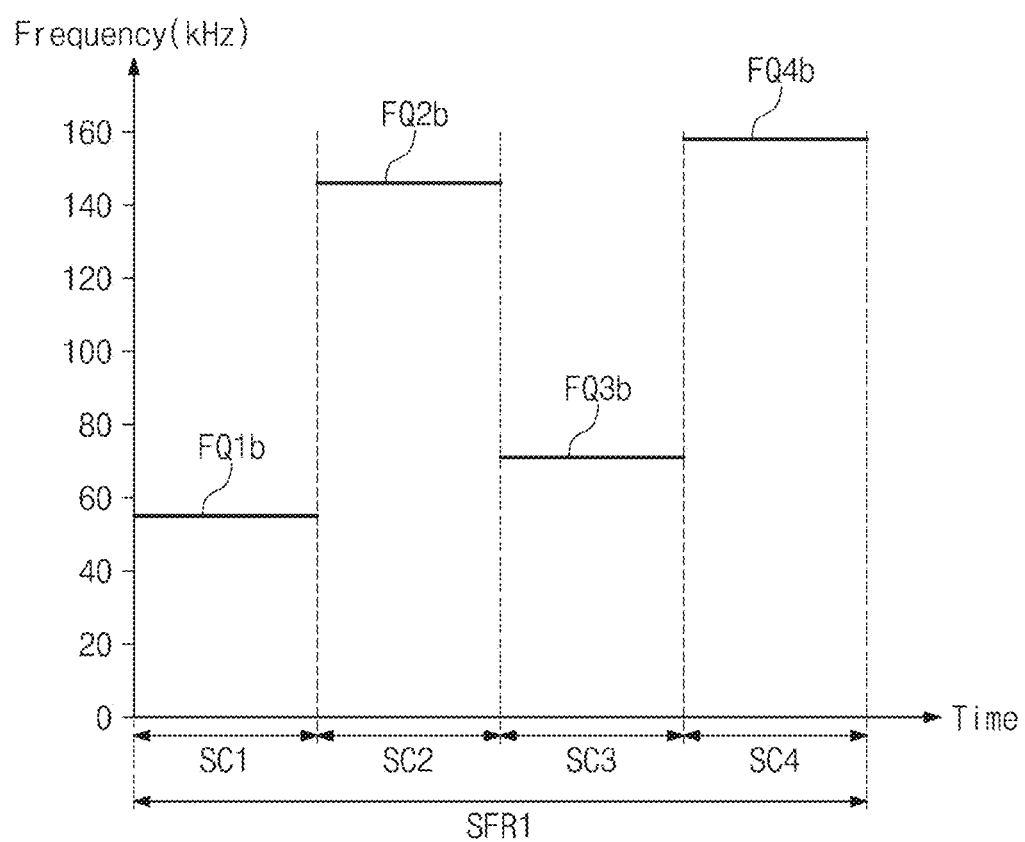
FIG. 15B is a graph illustrating a frequency change of one transmission signal in a proximity sensing mode according to an embodiment of the inventive concept.

FIG. 15B is a graph illustrating a frequency change (e.g., hopping) of one transmission signal in a proximity sensing mode according to an embodiment of the inventive concept. In the description of FIG. 15B, portions different from those of FIG. 15A will be described, and the same reference numerals are used for the same components, and descriptions thereof will be omitted.

Referring to FIGS. 14 and 15B, the frequency of the second transmission signal TXNaj may be hopped within one frame FRP1. For example, the frequency of the second transmission signal TXNaj may be hopped for each of a plurality of sub frames SFR1, SFR2, SFR3, SFR4, SFR5, and SFR6 included in one frame FRP1.

Thus, compared to FIG. 15A, according to the embodiment shown in FIG. 15B, the frequency of the second transmission signal TXNaj may be changed more quickly. For example, FIG. 15B shows a plurality of consecutive sections SC1, SC2, SC3, and SC4 included in one sub frame SFR1 and first to fourth frequencies FQ1b, FQ2b, FQ3b, and FQ4b corresponding thereto. The first frequency FQ1b may be 55 kHz, the second frequency FQ2b may be 146 kHz, the third frequency FQ3b may be 71 kHz, and the fourth frequency FQ4b may be 158 kHz, but the embodiment of the inventive concept is not particularly limited thereto.

Figure 16A:
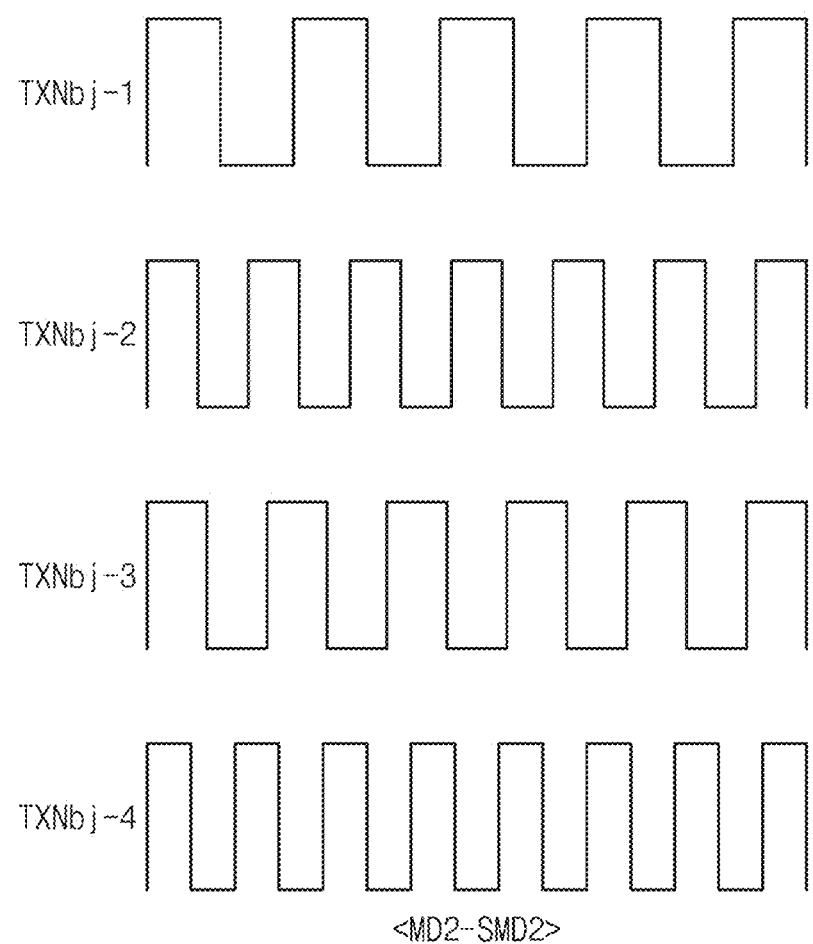
FIG. 16A is a waveform diagram of a plurality of transmission signals provided to one first electrode according to an embodiment of the inventive concept.
Figure 16B:
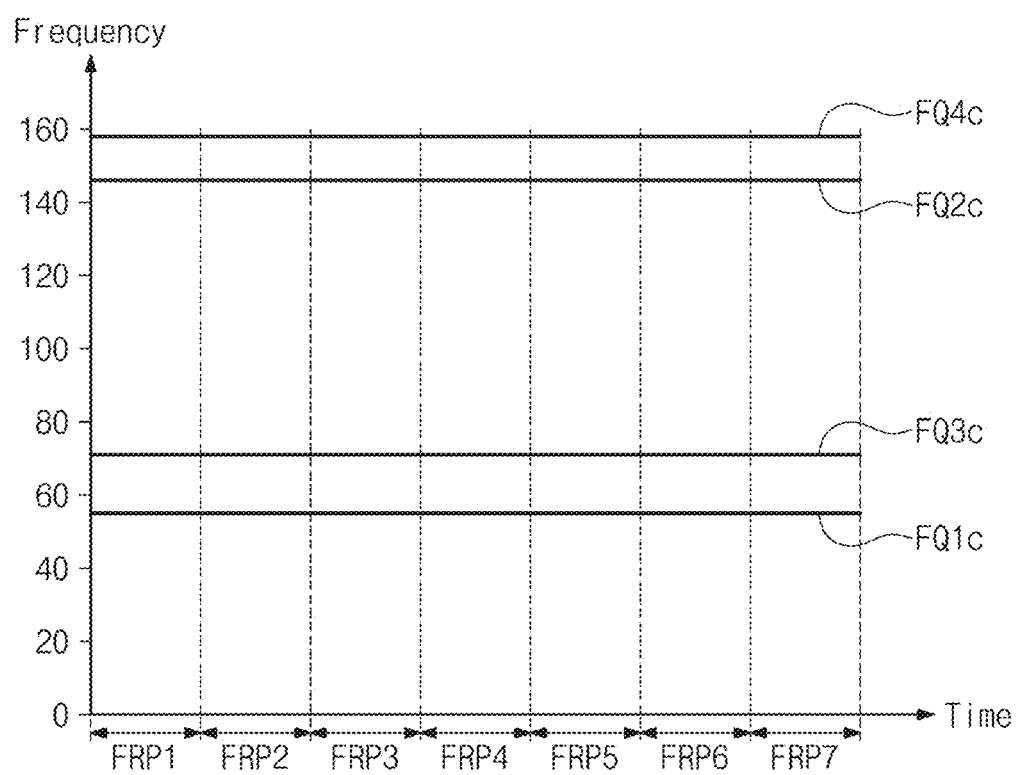
FIG. 16B are graphs illustrating frequencies of a plurality of transmission signals provided to one first electrode in a proximity sensing mode according to an embodiment of the inventive concept.

FIG. 16A is a waveform diagram of a plurality of transmission signals provided to one first electrode according to an embodiment of the inventive concept. FIG. 16B graphs frequencies of a plurality of transmission signals provided to one first electrode in a proximity sensing mode according to an embodiment of the inventive concept.

Referring to FIGS. 6, 16A and 16B, in the second driving mode SMD2, the sensor driver 200C may simultaneously output a plurality of transmission signals to each of the first electrodes 210. For example, one first electrode 210 may simultaneously receive a second transmission signal TXNbj-1 having a first frequency FQ1c, a third transmission signal TXNbj-2 having a second frequency FQ2c, a fourth transmission signal TXNbj-3 having a third frequency FQ3c, and a fifth transmission signal TXNbj-4 having a fourth frequency FQ4c. In this case, the sensor driver 200C may read out a detection signal for a specific frequency among the first to fourth frequencies FQ1c, FQ2c, FQ3c, and FA4c.

Providing a relatively low frequency transmission signal to the first electrodes 210 may be advantageous for improving proximity sensing sensitivity. However, in a frequency band of one hundred and several tens of kHz or less, a band having a risk of causing noise in the display layer 100 (e.g., see FIG. 4) may be included. Therefore, when both a relatively low frequency transmission signal and a relatively high frequency transmission signal are provided to one first electrode 210, an effect similar to that of providing a relatively high frequency transmission signal to each of the first electrodes 210 may be obtained. As a result, a probability of causing noise in the display layer 100 may be reduced. Accordingly, proximity sensing performance of the electronic device 1000 (e.g., see FIG. 1) may be improved, and also image quality may be improved.

In FIGS. 16A and 16B, four transmission signals of different frequencies are provided to one first electrode 210 as an example, but the embodiment of the inventive concept is not particularly limited thereto. For example, if two transmission signals having different frequencies are provided to one first electrode 210, the embodiment described in FIGS. 16A and 16B may be modified in various ways.

Figure 17:
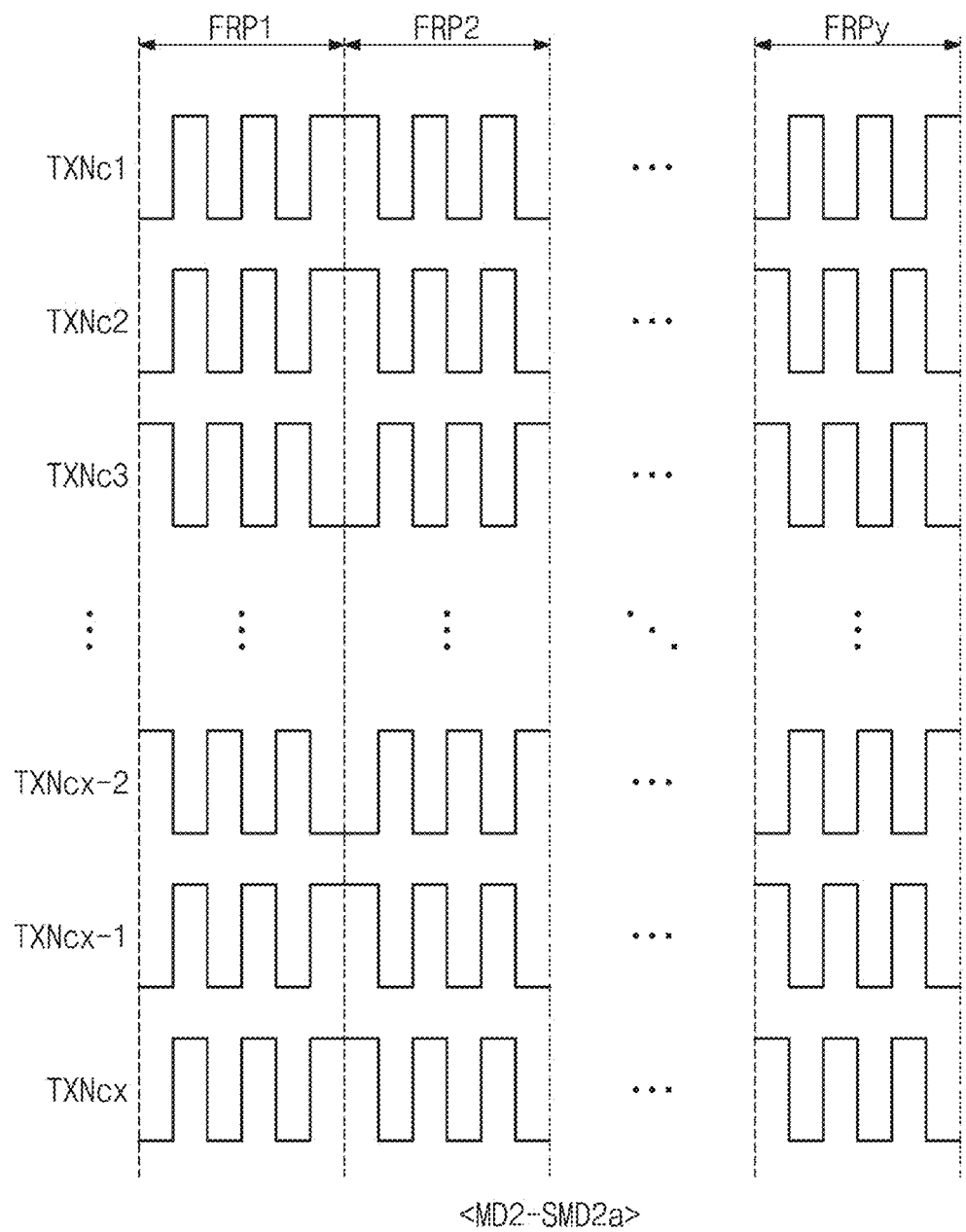
FIG. 17 is a waveform diagram of transmission signals according to an embodiment of the inventive concept.

FIG. 17 is a waveform diagram of transmission signals according to an embodiment of the inventive concept.

Referring to FIGS. 6 and 17, in the second mode MD2, the sensor driver 200C may be driven in a first driving mode SMD1 (e.g., see FIG. 12A) or a second driving mode SMD2a. FIG. 17 describes the second driving mode SMD2a.

FIG. 13A illustrates second transmission signals TXNc1, TXNc2, TXNc3, . . . , TXNcx-2, TXNcx-1, and TXNcx corresponding to a plurality of frames FRP1, FRP2, and FRPy when the sensor layer 200 defines a time unit for detecting an input as a frame. In this example, x may be an integer of 6 or greater, and y may be an integer of 3 or greater. The second transmission signals TXNc1, TXNc2, TXNc3, . . . , TXNcx-2, TXNcx-1, TXNcx may be provided to the first electrodes 210, respectively.

The second transmission signals TXNc1, TXNc2, TXNc3, . . . , TXNcx-2, TXNcx-1, TXNcx may be divided into 2-1 transmission signals and 2-2 transmission signals according to the phase difference. For example, the 2-1 transmission signal may be a transmission signal having a first phase and may be referred to as a normal phase transmission signal. The 2-2 transmission signal may be a transmission signal having a second phase different from the first phase, and may be referred to as a reverse phase transmission signal. For example, the difference between the first phase and the second phase may be 180 degrees.

In the first frame FRP1, the second transmission signals TXNc1, TXNc2, TXNc3, . . . , TXNcx-2, TXNcx-1, TXNcx may be divided into 2-1 transmission signals TXNc3 and TXNcx-2 and 2-2 transmission signals TXNc1, TXNc2, TXNcx-1, and TXNcx.

According to one embodiment of the inventive concept, because the second transmission signals TXNc1, TXNc2, TXNc3, . . . , TXNcx-2, TXNcx-1, TXNcx include a normal phase transmission signal and a reverse phase transmission signal having different phases, a flicker phenomenon may be reduced or eliminated in an image displayed on the display layer 100, even though the transmission signals may have the same frequency. Thus, the probability of causing noise in the display layer 100 may be reduced. Accordingly, proximity sensing performance of the electronic device 1000 (e.g., see FIG. 1) may be improved, and also image quality may be improved.

In one embodiment of the inventive concept, the number of 1-1 electrodes to which the 2-1 transmission signals TXNc3 and TXNcx-2 are provided among the first electrodes 210 in every frame (for example, the first frame FRP1) may be different from the number of 1-2 electrodes to which the 2-2 transmission signals TXNc1, TXNc2, TXNcx-1, and TXNcx are provided. For example, the number of the first-first electrodes may be greater than the number of the first-second electrodes, but the embodiment of the inventive concept is not particularly limited thereto. For example, the number of the first-second electrodes may be greater than the number of the first-first electrodes. Because the number of the 1-1 electrodes and the number of the 1-2 electrodes are different, even if the 2-1 transmission signals TXNc3 and TXNcx-2 and the 2-2 transmission signals TXNc1, TXNc2, TXNcx-1, and TXNcx are canceled by the phase difference, approach of the object 3000 (e.g., see FIG. 2) may be sufficiently detected.

In one embodiment of the inventive concept, the phase of each of the second transmission signals TXNc1, TXNc2, TXNc3, . . . , TXNcx-2, TXNcx-1, TXNcx may be changed every frame. For example, the positions of the first and second electrodes among the first electrodes 210 may be changed every frame. For example, in the first frame FRP1, the second transmission signals TXNc1, TXNc2, TXNcx-1, and TXNcx may be reverse phase signals, and in the second frame FRP2, the second transmission signals TXNc3 and TXNcx-2 may be reverse phase signals, and in the y-th frame FRPy, the second transmission signals TXNc1 and TXNcx-2 may be reverse phase signals.

In one embodiment of the inventive concept, the sensor layer 200 may include 18 first electrodes 210 sequentially arranged along the first direction DR1. In this case, in the first frame FRP1, the first-second electrodes may be $1^{st}$, $2^{nd}$, $17^{th}$, and $18^{th}$ first electrodes 210, and in the second frame FRP2, the first-second electrodes may be $5^{th}$, $6^{th}$, $11^{th}$, and $12^{th}$ first electrodes 210, and in the third frame, the 1-2 electrodes may be the $3^{rd}$, $4^{th}$, $16^{th}$, and $17^{th}$ first electrodes 210, and in the fourth frame, the first to second electrodes may be $1^{st}$, $6^{th}$, $13^{th}$, and $17^{th}$ first electrodes 210.

In FIG. 17, it is exemplified that the first and second electrodes to which the transmission signal of the reverse phase is provided may be determined for each frame, but the embodiment of the inventive concept is not particularly limited thereto. For example, the first and second electrodes to which the reverse phase transmission signal is provided may be determined every two or more frames.

Figure 18:
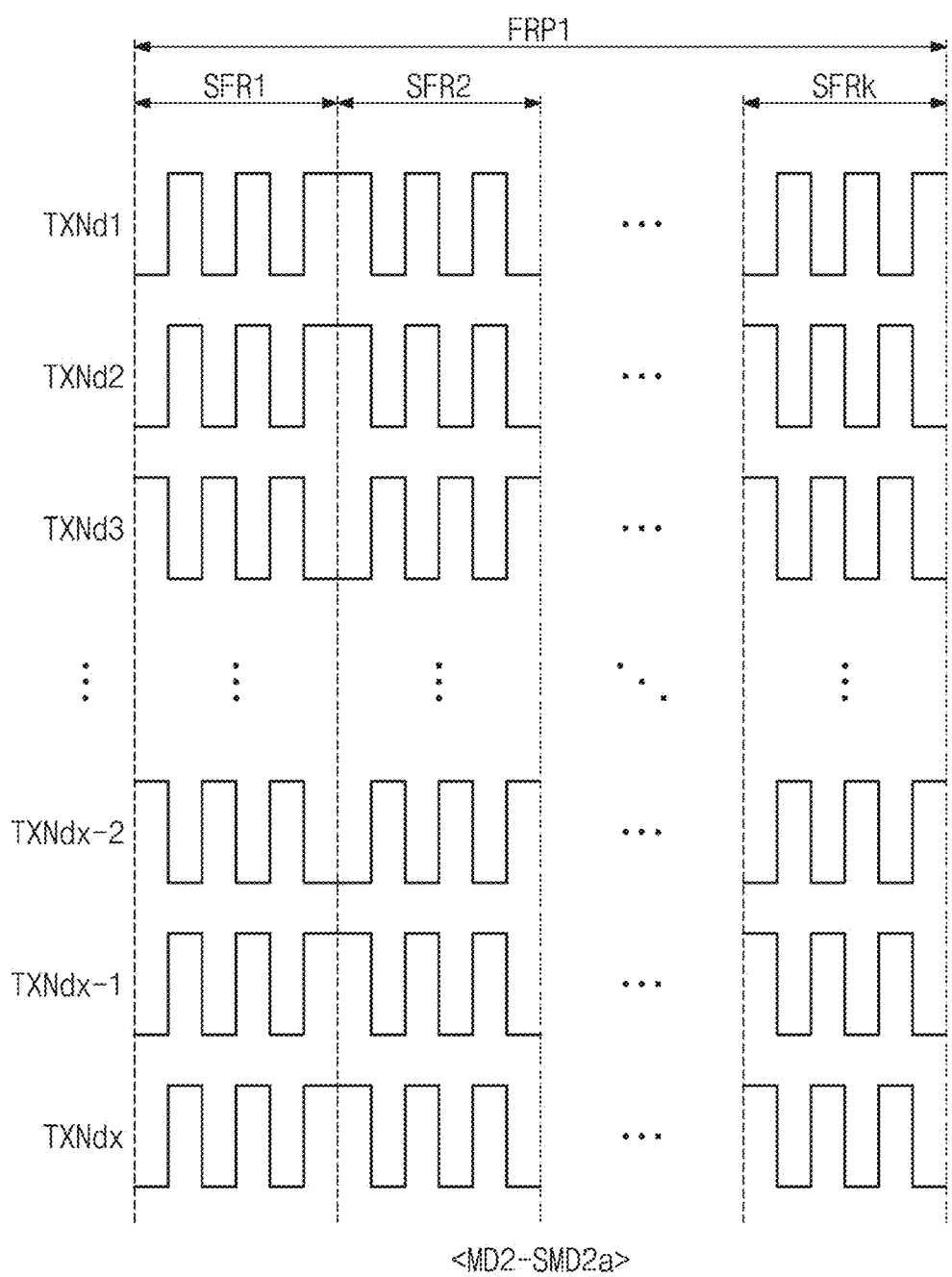
FIG. 18 is a waveform diagram of transmission signals according to an embodiment of the inventive concept.

FIG. 18 is a waveform diagram of transmission signals according to an embodiment of the inventive concept. In the description of FIG. 18, portions different from those of FIG. 17 will be described, and the same reference numerals are used for the same components, and descriptions thereof will be omitted.

Referring to FIGS. 6 and 18, the phase of each of the second transmission signals TXNd1, TXNd2, TXNd3, . . . , TXNdx-2, TXNdx-1, TXNdx may be changed within one frame FRP1. For example, the phase of each of the second transmission signals TXNd1, TXNd2, TXNd3, . . . , TXNdx-2, TXNdx-1, TXNdx may be determined for each of sub frames SFR1, SFR2, . . . , SFRk included in one frame FRP1. The frequency of the second transmission signals may be the same or different.

In one embodiment of the inventive concept, the sensor layer 200 may include 18 first electrodes 210 sequentially arranged along the first direction DR1. In this case, in the first sub frame SFR1, the 1-2 electrodes may be $1^{st}$, $2^{nd}$, $2^{nd}$, $17^{th}$, and $18^{th}$ first electrodes 210, and in the second sub frame SFR2, the 1-2 electrodes may be 5th, 6th, 11th, and 12th first electrodes 210, and in the third sub frame, the 1-2 electrodes may be the $3^{rd}$, $4^{th}$, $13^{th}$, and $14^{th}$ first electrodes 210, and in the fourth sub frame, the 1-2 electrodes may be the $2^{nd}$, $4^{th}$, $16^{th}$, and $17^{th}$ first electrodes 210, and in the fifth sub frame, the 1-2 electrodes may be the $1^{st}$, $6^{th}$, $13^{th}$, and $17^{th}$ first electrodes 210, and in the sixth sub frame, the 1-2 electrodes may be the $3^{rd}$, $5^{th}$, $12^{th}$, and $15^{th}$ first electrodes 210.

Figure 19:
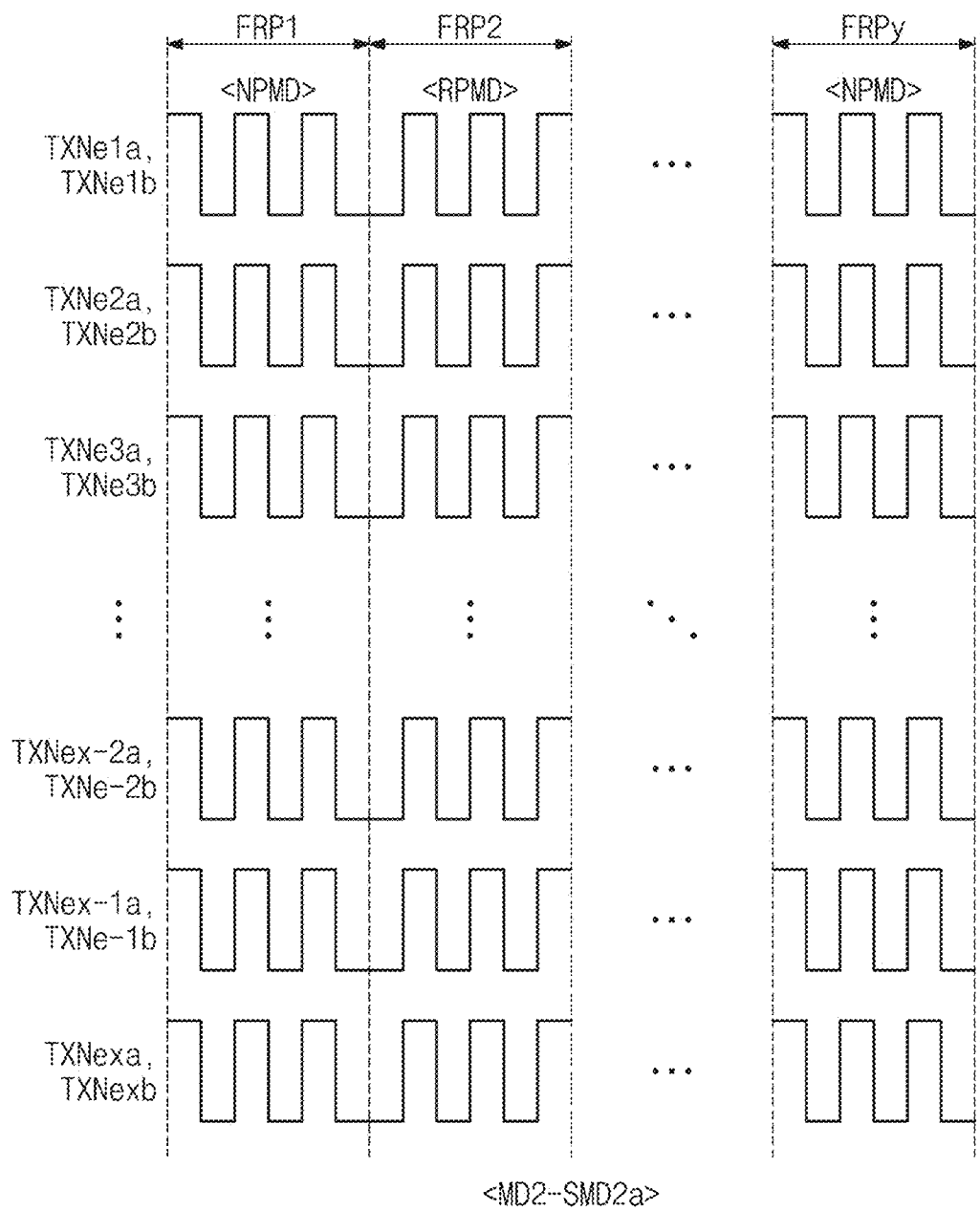
FIG. 19 is a waveform diagram of transmission signals according to an embodiment of the inventive concept.

FIG. 19 is a waveform diagram of transmission signals according to an embodiment of the inventive concept.

Referring to FIGS. 6 and 19, the sensor driver 200C may operate in a normal phase driving mode NPMD and a reverse phase driving mode RPMD in the second driving mode SMD2a. In an embodiment of the inventive concept, the sensor driver 200C may operate in at least one of a normal phase driving mode NPMD or a reverse phase driving mode RPMD for every frame. For example, in the first frame FRP1, the sensor driver 200C may simultaneously output the second transmission signals TXNe1a, TXNe2a, TXNe3a, . . . , TXNex-2a, TXNex-1a, TXNexa to the first electrodes 210. And, in the second frame FRP2, the sensor driver 200C may simultaneously output the third transmission signals TXNe1b, TXNe2b, TXNe3b, . . . , TXNex-2b, TXNex-1b, TXNexb having a different phase from the second transmission signals TXNe1a, TXNe2a, TXNe3a, . . . , TXNex-2a, TXNex-1a, TXNexa to the first electrodes 210. The different phase may represent a phase shift of a predetermined angle, e.g., 180 degrees.

In one embodiment of the inventive concept, the second transmission signals TXNe1a, TXNe2a, TXNe3a, . . . , TXNex-2a, TXNex-1a, TXNexa may have the same phase and the same waveform, and the third transmission signals TXNe1b, TXNe2b, TXNe3b, . . . , TXNex-2b, TXNex-1b, TXNexb may have the same phase and the same waveform.

In one embodiment of the inventive concept, the sensor driver 200C may operate in the normal phase driving mode NPMD in the first frame FRP1 and in the reverse phase driving mode RPMD in the second frame FRP2. The sensor driver 200C may alternately and repeatedly operate in a normal phase driving mode NPMD and a reverse phase driving mode RPMD, but the embodiment of the inventive concept is not particularly limited thereto. For example, the sensor driver 200C may operate in the normal phase driving mode NPMD for a plurality of frames and then operate in the reverse phase driving mode RPMD for one frame.

Figure 20:
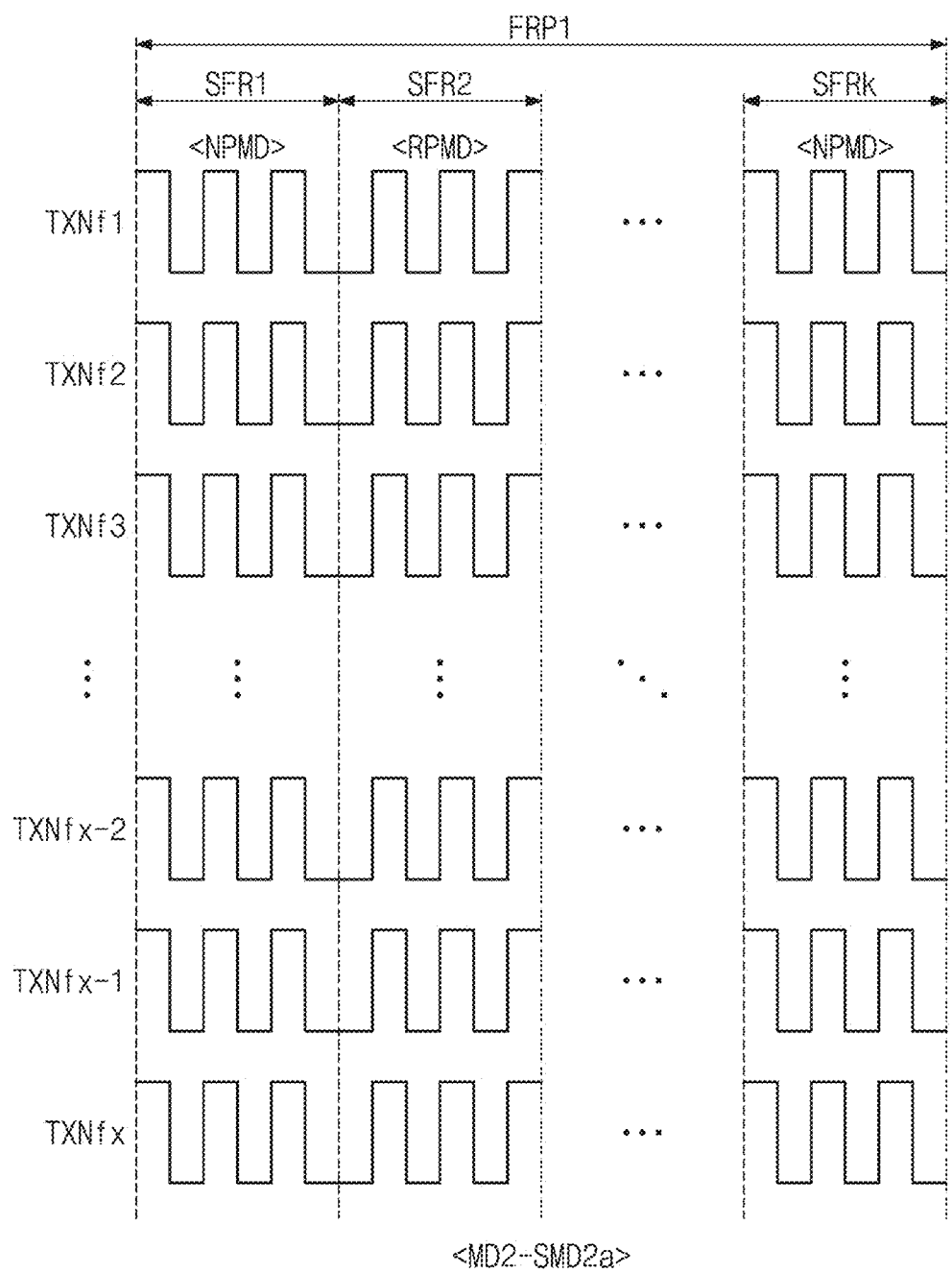
FIG. 20 is a waveform diagram of transmission signals according to an embodiment of the inventive concept.

FIG. 20 is a waveform diagram of transmission signals according to an embodiment of the inventive concept. In the description of FIG. 20, portions different from those of FIG. 19 will be described, and the same reference numerals are used for the same components, and descriptions thereof will be omitted.

Referring to FIGS. 6 and 20, the second transmission signals TXNf1, TXNf2, TXNf3, . . . , TXNfx-2, TXNfx-1, TXNfx may have the same phase and the same waveform. The phases of the second transmission signals TXNf1, TXNf2, TXNf3, . . . , TXNfx-2, TXNfx-1, TXNfx may be changed within one frame FRP1. For example, phases of the second transmission signals TXNf1, TXNf2, TXNf3, . . . , TXNfx-2, TXNfx-1, TXNfx may be determined for each of sub frames SFR1, SFR2, . . . , SFRk included in one frame FRP1.

In one embodiment of the inventive concept, the sensor driver 200C may operate in at least one of a normal phase driving mode NPMD or a reverse phase driving mode RPMD for each of sub frames SFR1, SFR2, . . . , SFRk. For example, the sensor driver 200C may operate in the normal phase driving mode NPMD in the first sub frame SFP1 and in the reverse phase driving mode RPMD in the second sub frame SFR2.

Figure 21:
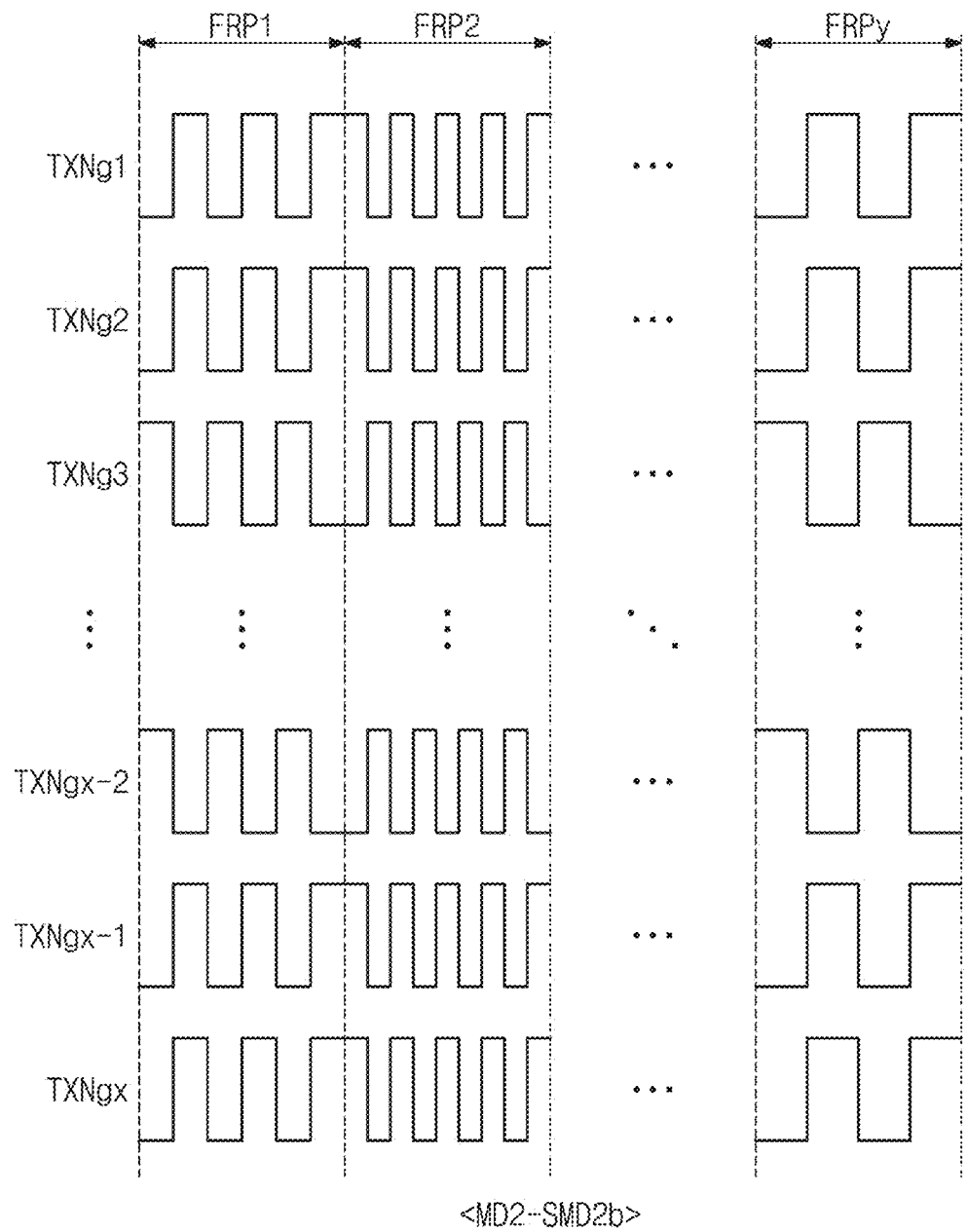
FIG. 21 is a waveform diagram of transmission signals according to an embodiment of the inventive concept.

FIG. 21 is a waveform diagram of transmission signals according to an embodiment of the inventive concept. Referring to FIGS. 6 and 21, the sensor driver 200C may simultaneously output second transmission signals TXNg1, TXNg2, TXNg3, . . . , TXNgx-2, TXNgx-1, TXNgx to the first electrodes 210 in the second driving mode SMD2b. For example, the second transmission signals TXNg1, TXNg2, TXNg3, . . . , TXNgx-2, TXNgx-1, TXNgx may be signals in the form of a combination of the embodiment described with reference to FIG. 13A and the embodiment described with reference to FIG. 17. According to such a combination, both the frequency and phase of the second transmission signals may be changed in different periods of time, e.g., from frame to frame or within different sub frames of a frame. For example, the transmission signals may have a first frequency and first phase in frame FRP1 and may have a second frequency and second phase in an adjacent frame FRP2.

More specifically, FIG. 21 illustrates second transmission signals TXNg1, TXNg2, TXNg3, . . . , TXNgx-2, TXNgx-1, TXNgx corresponding to the plurality of frames FRP1, FRP2, and FRPy. The frequencies of the second transmission signals TXNg1, TXNg2, TXNg3, . . . , TXNgx-2, TXNgx-1, TXNgx may be changed every frame, and within a frame, the second transmission signals TXNg1, TXNg2, TXNg3, . . . , TXNgx-2, TXNgx-1, TXNgx may be divided into 2-1 transmission signals of a normal phase and 2-2 transmission signals of a reverse phase.

In FIG. 21, signals in the form of a combination of the embodiment described in FIG. 13A and the embodiment described in FIG. 17 are exemplified, but the above-described embodiments may be combined in various ways. For example, signals in the form of a combination of any one of embodiments described with reference to FIG. 13A, 15A, 15B, or 16A and any one of embodiments described with reference to FIG. 17, 18, 19, or 20 may be simultaneously output to the first electrodes 210 in the second driving mode SMD2b.

Figure 22A:
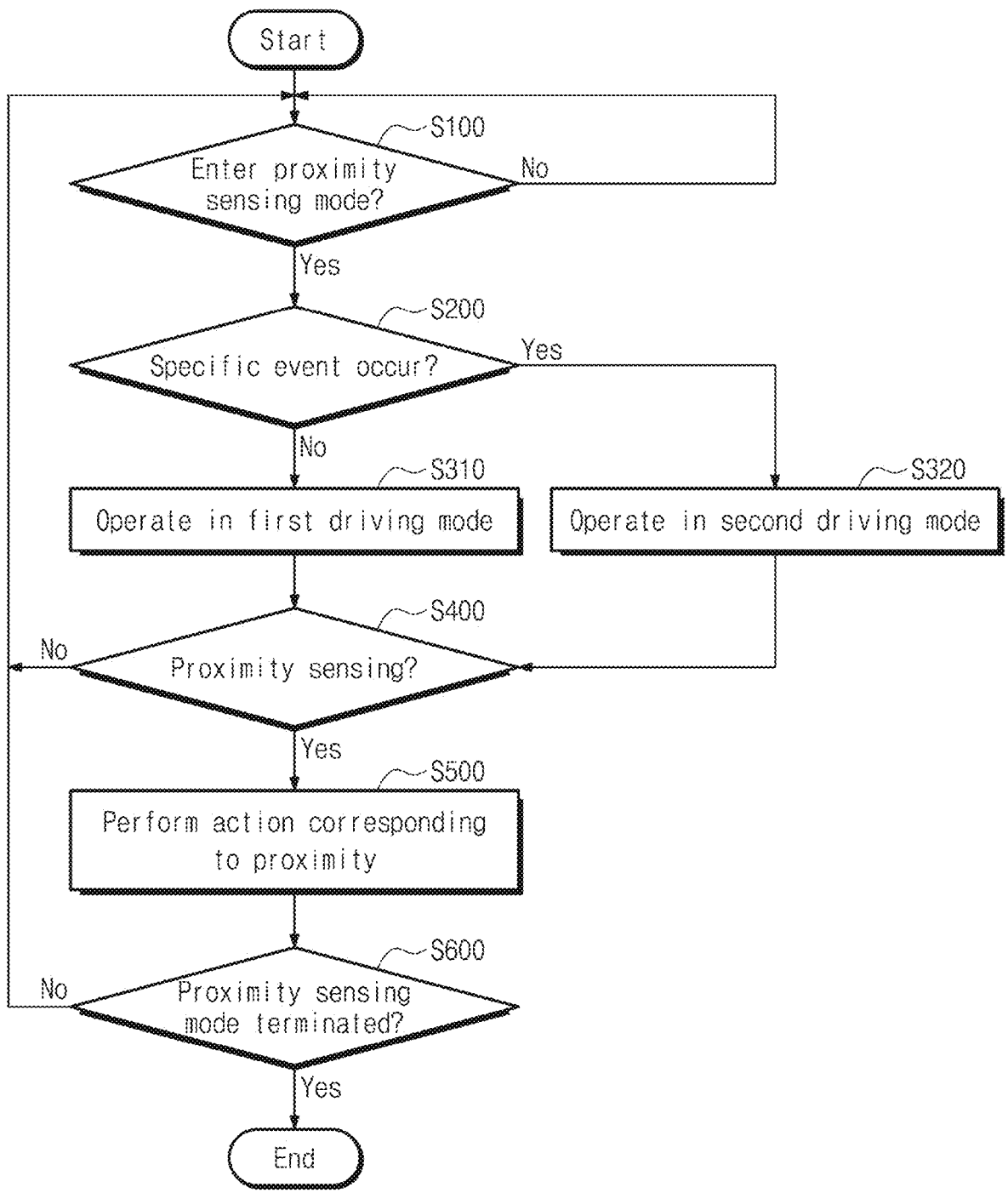
FIG. 22A is a flowchart illustrating an operation in a proximity sensing mode according to an embodiment of the inventive concept.
Figure 22B:
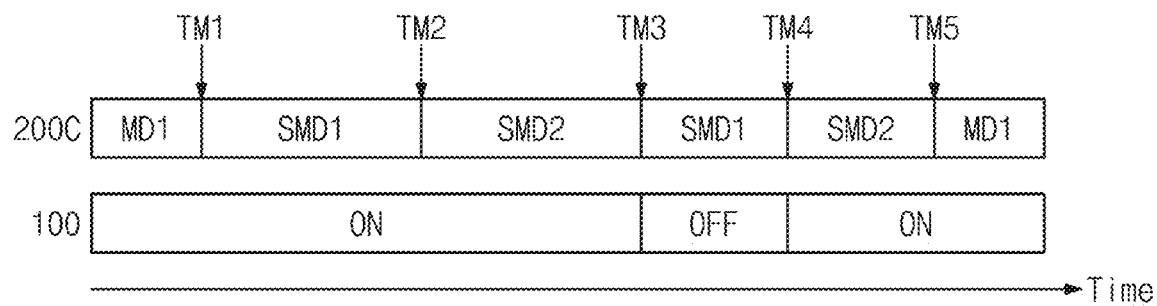
FIG. 22B is a diagram for explaining operations of a display layer and a sensor driver according to time.

FIG. 22A is a flowchart illustrating an operation in a proximity sensing mode according to an embodiment of the inventive concept. FIG. 22B is a diagram for explaining operations of a display layer and a sensor driver according to time.

Referring to FIGS. 2, 22A and 22B, the sensor driver 200C or the main driver 1000C determines whether to operate in the second mode (or proximity sensing mode) in S100. At a time point TM1 at which the second mode is entered, the sensor driver 200C may switch from the first mode MD1 to the first driving mode SMD1 and operate.

The sensor driver 200C or the main driver 1000C determines whether a specific event has occurred in S200. The specific event may be a case when the image displayed on the display layer 100 is a still image, when the image displayed on the display layer 100 changes from a moving image to a still image, when the display layer 100 is driven at a frequency of less than 60 Hz, when it is detected that the object 3000 approaching the surface 1000SF of the electronic device 1000 is separated from the surface (i.e., a change in proximity of the electronic device 1000 from the surface 1000SF), or the display layer 100 is changed from an off state to an on state. When a specific event occurs, a user may more easily view flicker caused by an image or a flicker phenomenon may more easily occur in the display layer 100.

The sensor driver 200C may operate in the first driving mode SMD1 in S310 when a specific event does not occur, and may operate in the second driving mode SMD2 in S320 when a specific event occurs.

According to an embodiment of the inventive concept, the sensor driver 200C may operate by converting the first driving mode SMD1 to the second driving mode SMD2 at a time point TM2 at which a specific event occurs. The second driving mode SMD2 may be a mode in which the frequency of the second transmission signal is changed (or hopped), as in the embodiments described with reference to FIGS. 13A, 15A, 15B, and 16A, or may be a mode in which the phase of the second transmission signal is changed as in the embodiments described with reference to FIGS. 17, 18, 19, and 20. In some embodiments, both the frequency and phase of the second transmission signal may be changed from period to period, e.g., from frame-to-frame or from sub frame-to-sub frame within a frame. Therefore, the flicker phenomenon in the image displayed on the display layer 100 may be reduced or eliminated. Thus, the probability of causing noise in the display layer 100 may be reduced. Accordingly, proximity sensing performance of the electronic device 1000 (e.g., see FIG. 1) may be improved, and also image quality may be improved.

In one embodiment of the inventive concept, the sensor driver 200C may operate by converting the second driving mode SMD2 to the first driving mode SMD1 at a time point TM3 when the display layer 100 changes from an on state to an off state. Thereafter, at a time point TM4 when the display layer 100 changes from an off state to an on state, the sensor driver 200C may operate by converting the first driving mode SMD1 to the second driving mode SMD2.

The main driver 1000C receives the generated signal I-NS from the sensor driver 200C, and determines whether proximity occurs based on the generated signal I-NS in S400, e.g., whether electronic device 1000 has come within proximity detection range of an object 3000. As a result of the determination, if proximity has occurred (e.g., the electronic device is within range), a measure corresponding to the proximity (such as turning off the display screen) may be taken in S500. However, if proximity does not occur (e.g., the electronic device is outside of the proximity detection range), the operation of the proximity sensing mode may be restarted by moving to S100.

Then, it is determined whether to end the proximity sensing mode in S600. If the proximity sensing mode is terminated based on a result of the determination, the termination procedure is performed. If the proximity sensing mode is not terminated, by moving to S100, the proximity sensing mode operation may be performed again. At the time point TM5 when the proximity sensing mode ends, the sensor driver 200C may operate by converting from the second driving mode SMD2 to the first mode MD1.

Figure 23:
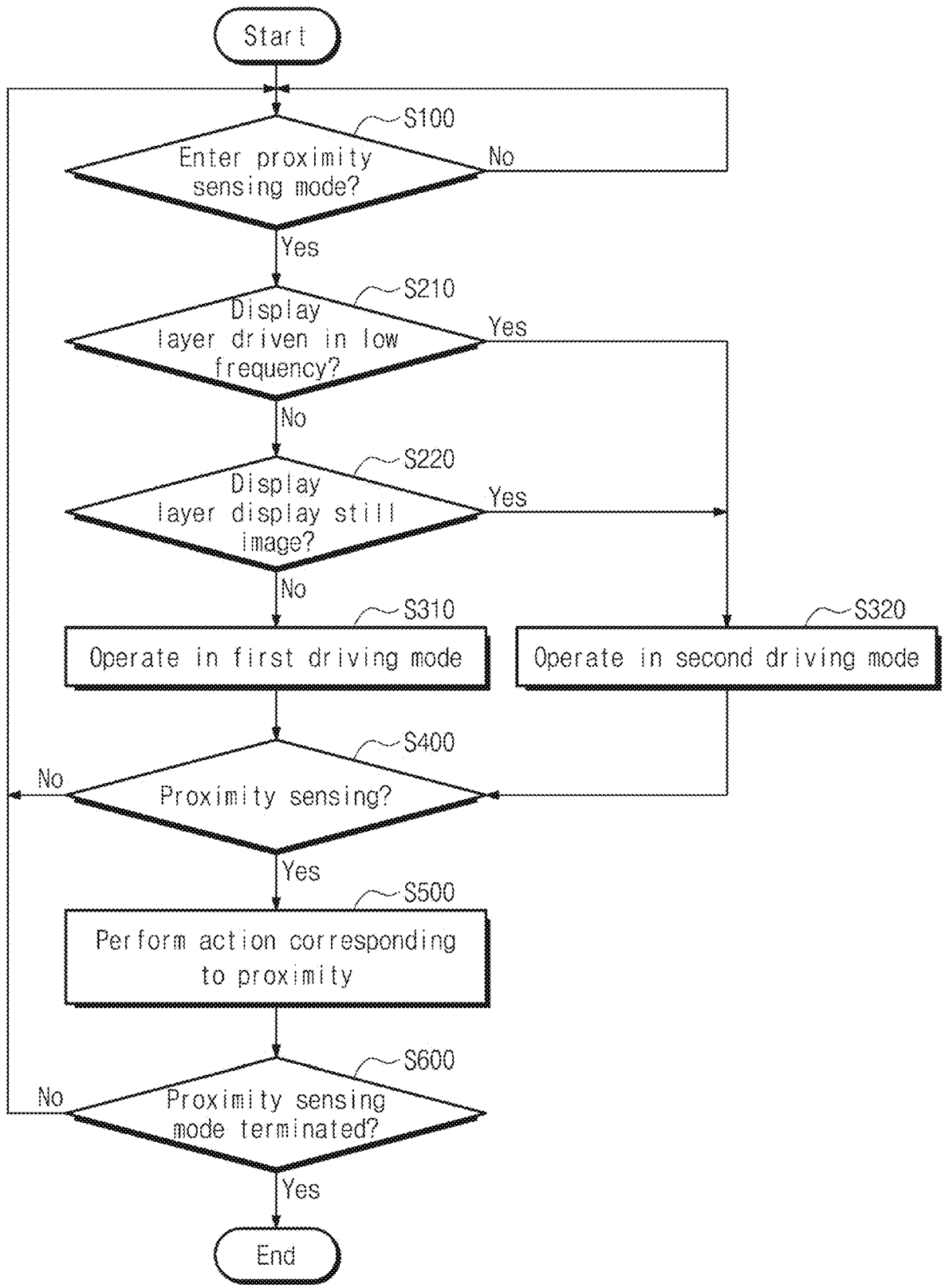
FIG. 23 is a flowchart illustrating an operation in a proximity sensing mode according to an embodiment of the inventive concept.

FIG. 23 is a flowchart illustrating an operation in a proximity sensing mode according to an embodiment of the inventive concept. In the description of FIG. 23, portions different from those of FIG. 22 will be described, and the same reference numerals are used for the same components, and descriptions thereof will be omitted.

Referring to FIGS. 2 and 23, the main driver 1000C determines whether the display layer 100 is driven in a predetermined frequency range, e.g., at a low frequency, in S210. A case in which the display layer 100 is driven at a frequency of less than 60 Hz may be determined as low frequency driving, but the criterion for determining the low frequency may be different in other embodiments. If the display layer 100 is driven at a low frequency, it may be an environment in which a user may more easily view flicker caused by an image. Accordingly, the sensor driver 200C may operate in the second driving mode in S320.

If the display layer 100 does not drive at a low frequency, the main driver 1000C determines whether the display layer 100 displays a still image in S220. When the display layer 100 does not display a still image, the sensor driver 200C may operate in the first driving mode in S310. When the display layer 100 displays a still image, a user may more easily recognize flicker caused by an image. Accordingly, the sensor driver 200C may operate in the second driving mode in S320.

Figure 24:
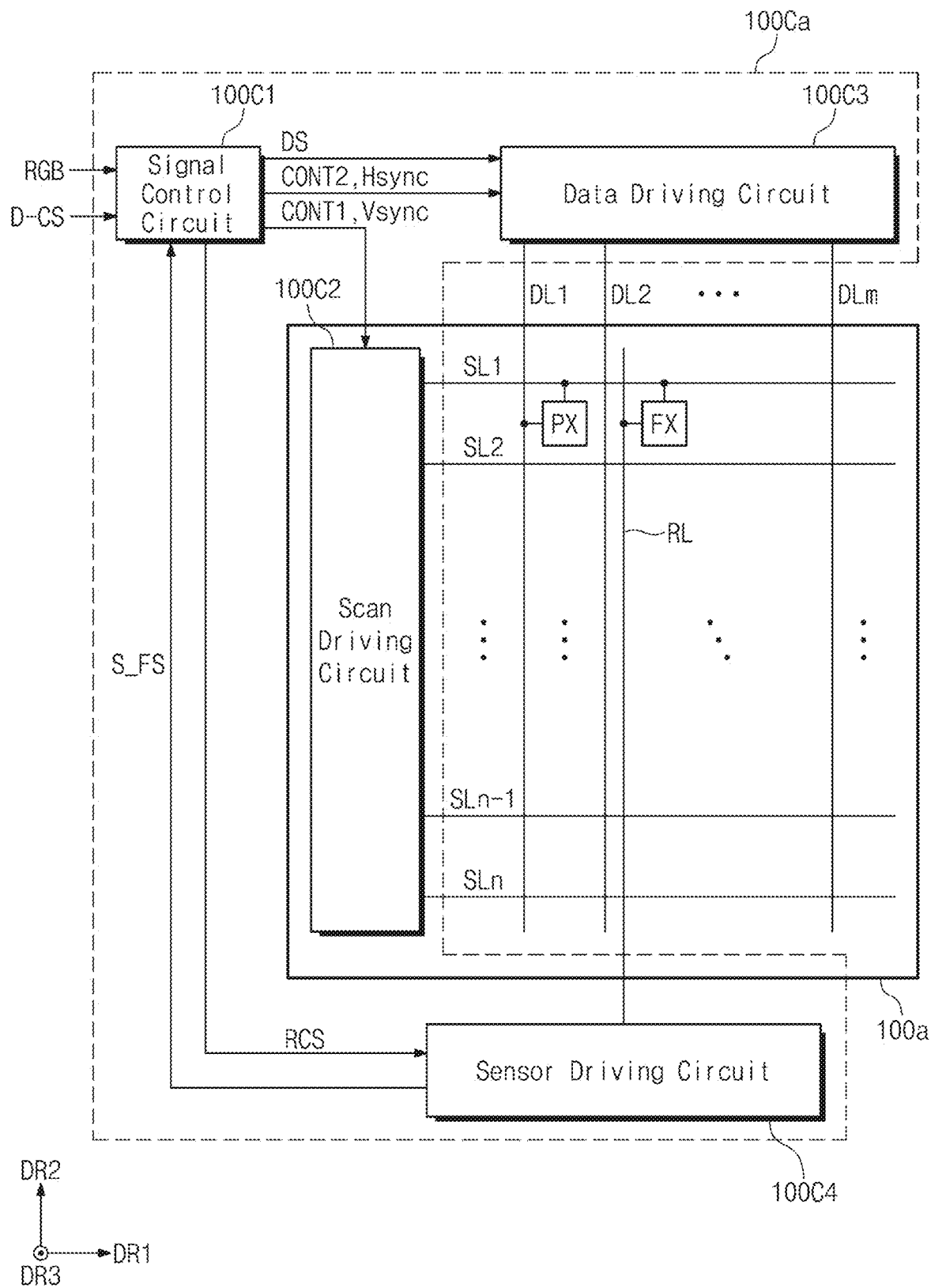
FIG. 24 is a block diagram of a display layer and a display driver according to an embodiment of the inventive concept.

FIG. 24 is a block diagram of a display layer 100a and a display driver 100Ca according to an embodiment of the inventive concept. In the description of FIG. 24, portions different from those of FIG. 5 will be described, and the same reference numerals are used for the same components, and descriptions thereof will be omitted.

Referring to FIG. 24, the display layer 100a may further include a light detection element FX. The display layer 100a may further include a readout line RL electrically connected to the light detection element FX. FIG. 24 representatively shows one light detection element FX and one readout line RL, but the display layer 100a may include a plurality of light detection elements and a plurality of readout lines.

The light detection element OPD may be a photodiode. As an example of the inventive concept, the light detection element OPD may be an organic photodiode including an organic material as a photoelectric conversion layer, but the embodiment of the inventive concept is not particularly limited thereto. The light detection element OPD may be exposed to light during an emission section of the light emitting element 100PE (e.g., see FIG. 4). The light detection element OPD may acquire fingerprint information of a user through a change in an electric field.

The display driver 100Ca may further include a sensor driving circuit 100C4. The sensor driving circuit 100C4 receives the third control signal RCS from the signal control circuit 100C1. The sensor driving circuit 100C4 may receive detection signals from the readout line RL in response to the third control signal RCS. The sensor driving circuit 100C4 may process the detection signals received from the readout lines RL and provide the processed detection signals S_FS to the signal control circuit 100C1.

Figure 25A:
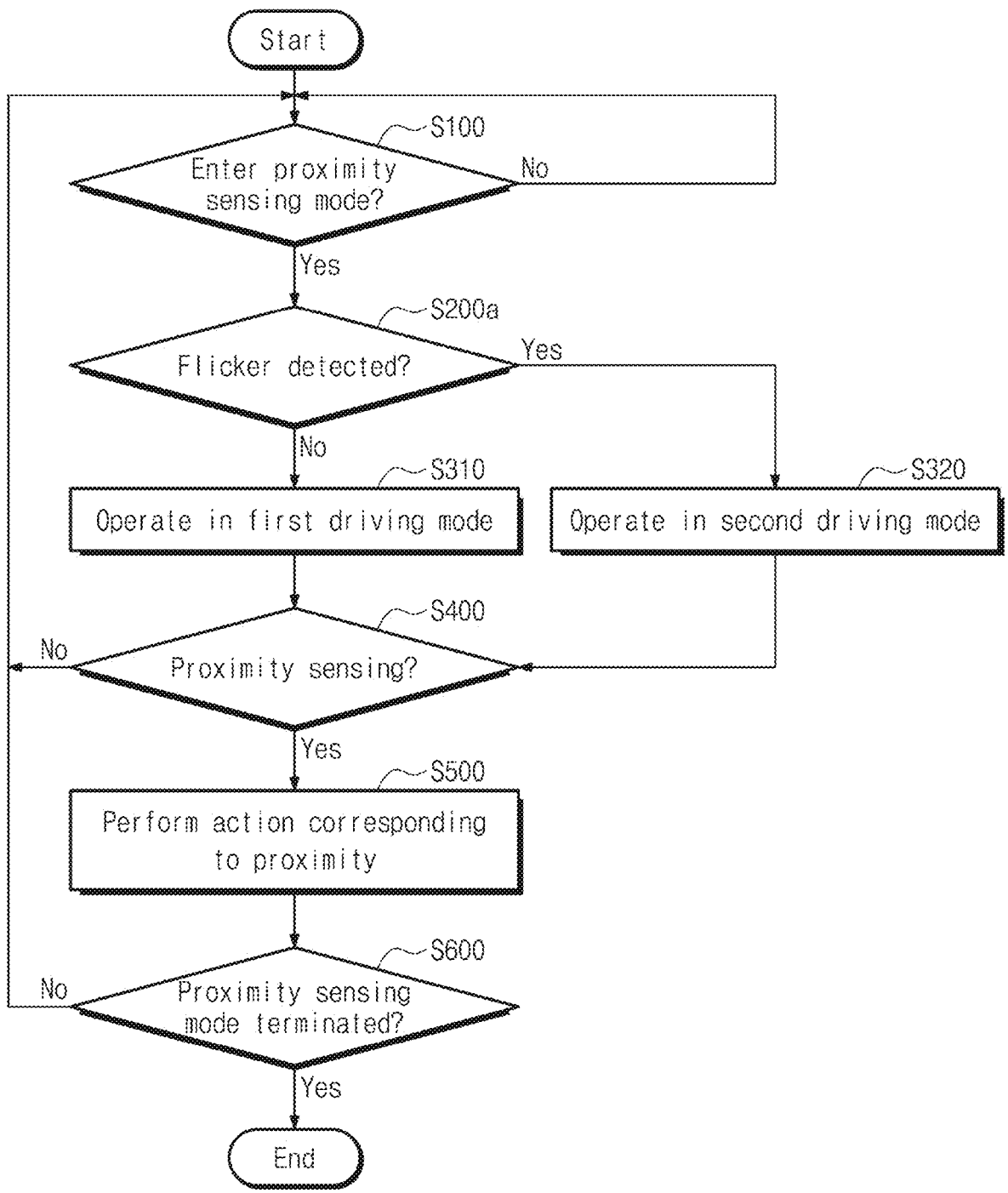
FIG. 25A is a flowchart illustrating an operation in a proximity sensing mode according to an embodiment of the inventive concept.

FIG. 25A is a flowchart illustrating an operation in a proximity sensing mode according to an embodiment of the inventive concept. In the description of FIG. 25A, portions different from those of FIG. 22 will be described, and the same reference numerals are used for the same components, and descriptions thereof will be omitted.

Referring to FIGS. 2, 24, and 25A, the main driver 1000C or the display driver 100C determines whether a specific event (e.g., flicker) is detected in S200a. Flicker may be detected by a light detection element OPD.

When flicker is not detected, the sensor driver 200C may operate in the first driving mode in S310. When flicker is detected, the sensor driver 200C may operate in the second driving mode in S320.

The second driving mode may be a mode in which the frequency of the second transmission signal is changed (or hopped), as in the embodiments described with reference to FIGS. 13A, 15A, 15B, and 16A, or may be a mode in which the phase of the second transmission signal is changed as in the embodiments described with reference to FIGS. 17, 18, 19, and 20, or a mode that performs a combination of changes of frequency and phase. Therefore, the flicker phenomenon in the image displayed on the display layer 100 may be reduced or eliminated. Accordingly, proximity sensing performance of the electronic device 1000 (e.g., see FIG. 1) may be improved, and also image quality may be improved.

Figure 25B:
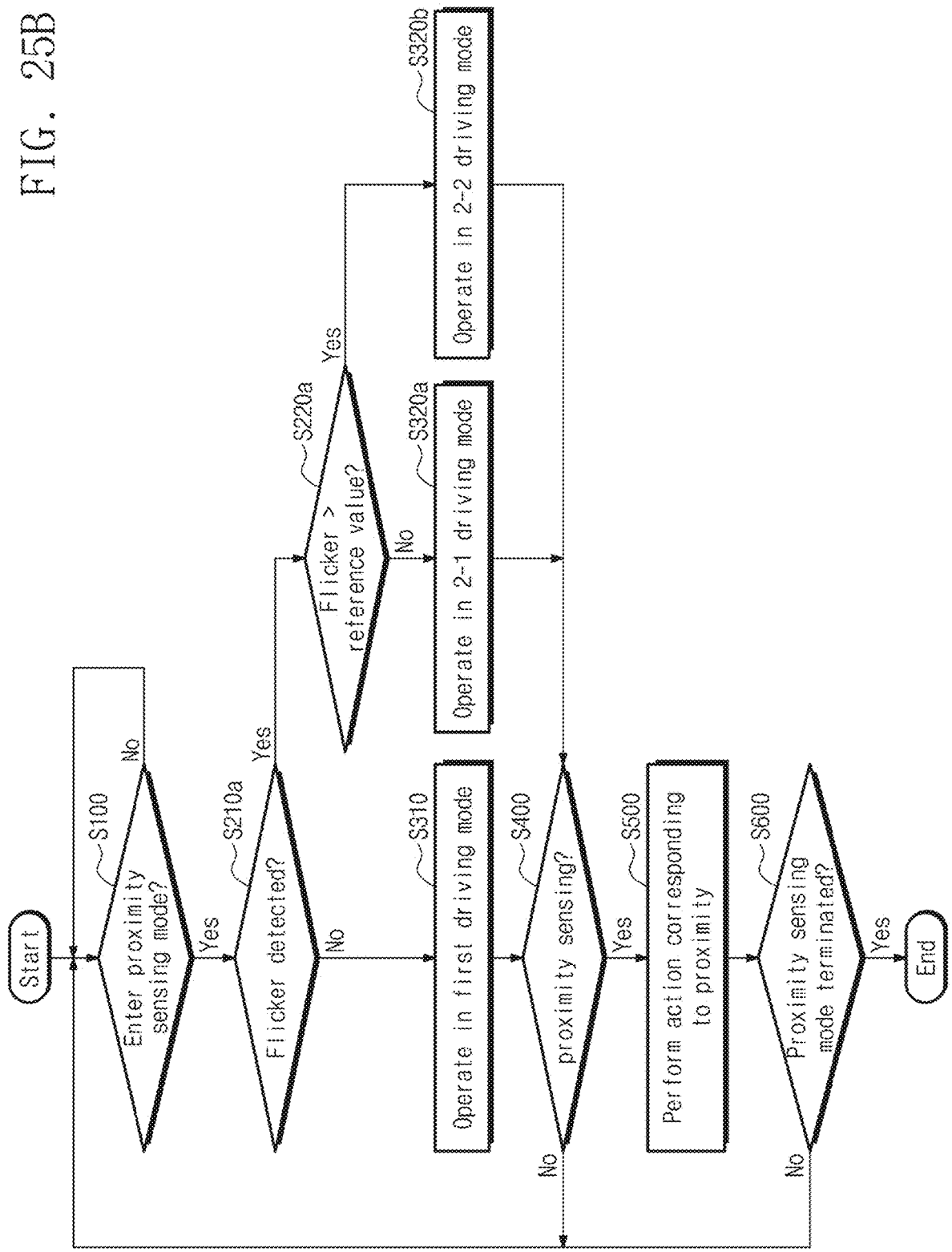
FIG. 25B is a flowchart illustrating an operation in a proximity sensing mode according to an embodiment of the inventive concept.

FIG. 25B is a flowchart illustrating an operation in a proximity sensing mode according to an embodiment of the inventive concept. In the description of FIG. 25B, portions different from those of FIGS. 22 and 25A will be described, and the same reference numerals are used for the same components, and descriptions thereof will be omitted.

Referring to FIGS. 2, 24, and 25B, the main driver 1000C or the display driver 100C determines whether a special event (e.g., flicker) is detected in S210a. Flicker may be detected by a light detection element OPD.

When flicker is not detected, the sensor driver 200C may operate in the first driving mode in S310. When flicker is detected, the main driver 1000C or the display driver 100C may determine whether the flicker is greater than or equal to a reference value in S220a. The reference value may be a predetermined frequency.

When the flicker is equal to or less than the reference value, the sensor driver 200C may operate in the 2-1 driving mode in S320a, and when the flicker exceeds the reference value, the sensor driver 200C may operate in the 2-2 driving mode in S320b.

The 2-1 driving mode may be a mode in which the frequency of the second transmission signal is changed as in the embodiments described with reference to FIGS. 13A, 15A, 15B, and 16A, and the 2-2 driving mode may be a mode in which the phase of the second transmission signal is changed as in the embodiments described with reference to FIGS. 17, 18, 19, and 20. For example, compared to the 2-1 driving mode in which the frequency of the transmission signal is changed and the probability of causing noise in the display layer 100 is reduced, the 2-2 driving mode in which flicker is reduced or eliminated by providing transmission signals of different phases may be more advantageous in terms of flicker reduction. Accordingly, according to the degree of flicker, the sensor driver 200C may selectively operate in the 2-1 driving mode or the 2-2 driving mode.

As described above, in the proximity sensing mode, the sensor driver may selectively operate in the first driving mode or the second driving mode. In the first driving mode, the sensor driver may simultaneously provide first transmission signals of the same phase to the plurality of first electrodes of the sensor layer. In this case, the strength of the proximity signal is increased, and thus the signal-to-noise ratio may be increased. Accordingly, a proximity sensing recognition distance (or an object recognizable height) may be increased. In the second driving mode, the sensor driver may simultaneously provide second transmission signals of which frequency or phase is changed to the plurality of first electrodes of the sensor layer, respectively. In this case, the probability of causing noise in the display layer by the second transmission signals may be reduced. Accordingly, not only proximity sensing performance of the electronic device may be improved, but also image quality may be improved.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, controller, or other signal processing device which is to execute the code or instructions for performing the method embodiments or operations of the apparatus embodiments herein.

The controllers, processors, drivers, other signal generating and signal processing features of the embodiments disclosed herein may be implemented, for example, in non-transitory logic that may include hardware, software, or both. When implemented at least partially in hardware, the controllers, processors, drivers, and other signal generating and signal processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, processors, drivers, and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

Although the embodiments of the inventive concept have been described, it is understood that the inventive concept should not be limited to these embodiments but various changes and modifications may be made by one ordinary skilled in the art within the spirit and scope of the inventive concept as hereinafter claimed. The embodiments may be combined to form additional embodiments.

What is claimed is:

1. An electronic device comprising:
a display layer configured to display an image;
a sensor layer disposed on the display layer and including a plurality of first electrodes and a plurality of second electrodes crossing the plurality of first electrodes; and
a sensor driver configured to drive the sensor layer and selectively operate in a first mode or a second mode different from the first mode,
wherein, in the second mode, the sensor driver is configured to selectively operate in a first driving mode to simultaneously output a plurality of first transmission signals to the plurality of first electrodes for detecting an object or in a second driving mode to simultaneously output a plurality of second transmission signals different from the plurality of first transmission signals to the plurality of first electrodes for detecting an object,
wherein when flicker is detected, the sensor driver selectively operates in the second driving mode of the second mode.

2. The electronic device of claim 1, wherein the plurality of first transmission signals are signals of a same phase.

3. The electronic device of claim 1, wherein the plurality of second transmission signals are signals of a same phase.

4. The electronic device of claim 1, wherein a frequency of each of the plurality of second transmission signals is hopped to a plurality of different frequencies in the second mode.

5. The electronic device of claim 4, wherein a frequency of each of the plurality of second transmission signals is hopped to different frequencies across a plurality of sub frames included in one frame.

6. The electronic device of claim 1, wherein a frequency of each of the plurality of second transmission signals is hopped to different frequencies in each of a plurality of frames.

7. The electronic device of claim 1, wherein a frequency of each of the plurality of second transmission signals is hopped within one frame.

8. The electronic device of claim 7, wherein intervals in which the frequency is hopped within the one frame are equal to each other.

9. The electronic device of claim 1, wherein a frequency of each of the plurality of second transmission signals is hopped in each of a plurality of sub frames included in one frame.

10. The electronic device of claim 1, wherein in the second driving mode:
the sensor driver is configured to simultaneously output the plurality of second transmission signals and a plurality of third transmission signals, having a frequency different from the frequency of the plurality of second transmission signals, to the plurality of first electrodes.

11. The electronic device of claim 1, wherein:
the plurality of second transmission signals comprise a 2-1 transmission signal having a first phase and a 2-2 transmission signal having a second phase different from the first phase, and
among the plurality of first electrodes, a number of 1-1 electrodes to which the 2-1 transmission signal is provided and a number of 1-2 electrodes to which the 2-2 transmission signal is provided are different from each other.

12. The electronic device of claim 11, wherein positions of the 1-2 electrodes to which the 2-2 transmission signal is provided are determined every frame.

13. The electronic device of claim 11, wherein positions of the 1-2 electrodes to which the 2-2 transmission signal is provided are changed within one frame.

14. The electronic device of claim 1, wherein in the second driving mode:
the sensor driver is configured to operate in a normal phase driving mode to simultaneously output the plurality of second transmission signals to the plurality of first electrodes, and in a reverse phase driving mode to simultaneously output a plurality of third transmission signals having a phase different from a phase of the plurality of second transmission signals to the plurality of first electrodes.

15. The electronic device of claim 14, wherein the sensor driver is configured to operate in at least one of the normal phase driving mode or the reverse phase driving mode for every frame.

16. The electronic device of claim 14, wherein the sensor driver is configured to operate in at least one of the normal phase driving mode or the reverse phase driving mode for each of a plurality of sub frames included in one frame.

17. An electronic device comprising:
a sensor layer including a plurality of first electrodes and a plurality of second electrodes crossing the plurality of first electrodes; and
a sensor driver configured to drive the sensor layer and selectively operate in a proximity sensing mode or a touch sensing mode,
wherein, in the proximity sensing mode, the sensor driver is configured to selectively operate in:
a first driving mode to simultaneously output a plurality of first transmission signals of a same phase to the plurality of first electrodes for detecting an object, or
a second driving mode to simultaneously output a plurality of second transmission signals different from the plurality of first transmission signals to the plurality of first electrodes for detecting the object,
wherein when flicker is detected, the sensor driver selectively operates in the second driving mode of the proximity sensing mode.

18. The electronic device of claim 17, wherein:
a frequency of each of the plurality of second transmission signals is hopped, and
the frequency hops every frame, hops every plurality of sub frames included in one frame, or hops within each of the plurality of sub frames.

19. The electronic device of claim 17, wherein:
in the second driving mode, the sensor driver is configured to operate in a normal phase driving mode to simultaneously output the plurality of second transmission signals to the plurality of first electrodes, and in a reverse phase driving mode to simultaneously output a plurality of third transmission signals having phases different from phases of the plurality of second transmission signals to the plurality of first electrodes,
the sensor driver is configured to operate in at least one of the normal phase driving mode or the reverse phase driving mode every frame, or
the sensor driver is configured to operate in at least one of the normal phase driving mode or the reverse phase driving mode for each of a plurality of sub frames included in one frame.

20. The electronic device of claim 17, wherein:
the plurality of second transmission signals comprise a 2-1 transmission signal having a first phase and a 2-2 transmission signal having a second phase different from the first phase,
among the plurality of first electrodes, a number of 1-1 electrodes to which the 2-1 transmission signal is provided and a number of 1-2 electrodes to which the 2-2 transmission signal are different from each other, and
positions of the 1-2 electrodes to which the 2-2 transmission signal is provided are changed every frame or changed within one frame.

* * * * *